(12) United States Patent
Cho et al.

(10) Patent No.: US 8,014,121 B2
(45) Date of Patent: Sep. 6, 2011

(54) ELECTRICAL DISCHARGE COUNTERMEASURE DEVICE

(75) Inventors: Mengu Cho, Kitakyushi (JP); Yuya Sanmaru, Kitakyushu (JP); Satoshi Hosoda, Kitakyushu (JP); Minoru Iwata, Kitakyushu (JP); Tatsuhito Fujita, Chofu (JP); Yasumasa Hisada, Tsukuba (JP)

(73) Assignees: Kyushu Institute of Technology, Fukuoka (JP); Japan Aerospace Exploration Agency, Chofu-shi, Tokyo (JP)

( * ) Notice: Subject to any disclaimer, the term of this patent is extended or adjusted under 35 U.S.C. 154(b) by 450 days.

(21) Appl. No.: 12/303,394

(22) PCT Filed: Jun. 1, 2007

(86) PCT No.: PCT/JP2007/061173
§ 371 (c)(1),
(2), (4) Date: Dec. 4, 2008

(87) PCT Pub. No.: WO2007/142133
PCT Pub. Date: Dec. 13, 2007

(65) Prior Publication Data
US 2009/0207546 A1 Aug. 20, 2009

(30) Foreign Application Priority Data
Jun. 6, 2006 (JP) ................................. 2006-156782

(51) Int. Cl.
H02H 1/00 (2006.01)
(52) U.S. Cl. .......................... 361/212; 361/117; 361/118
(58) Field of Classification Search ........................ None
See application file for complete search history.

(56) References Cited

U.S. PATENT DOCUMENTS
4,489,906 A * 12/1984 Fellas ......................... 244/171.7
6,713,670 B2 * 3/2004 Stern et al. ................... 136/251

FOREIGN PATENT DOCUMENTS

| EP | 0 637 900 A1 | 2/1995 |
| JP | 61-190805 | 8/1986 |
| JP | 7-52900 | 2/1995 |
| JP | 2005-267962 | 9/2005 |

OTHER PUBLICATIONS

David L. Cooke and Michael Geis; Introducing the Passive Anode Surface Emission Cathode; 38th AIAA/ASME/SAE/ASEE Joint Propulsion Conference & Exhibit Jul. 7-10, 2002, Indianapolis, Indiana.

(Continued)

*Primary Examiner* — Stephen W Jackson
*Assistant Examiner* — Terrence R Willoughby
(74) *Attorney, Agent, or Firm* — McGlew and Tuttle, P.C.

(57) ABSTRACT

The present invention prevents occurrence of electrical discharge on an electrically conductive structure in an environment in which high-energy electrons impinge onto the structure or on an electronic element mounted to a surface of the structure, which electrical discharge would otherwise occur when the potential of the structure or the electronic element increases in the negative direction due to a negative charge flowing thereinto. An insulating tape bonded to the surface of the electrically conductive structure is partially cut-removed; an electrically conductive adhesive is applied to an exposed portion of the surface of the electrically conductive structure; and an insulating film is bonded to the electrically conductive adhesive, such that the electrically conductive adhesive is exposed to the outside. When encountering higher-energy electrons, the insulating film is charged, so that a strong electric field is applied to the electrically conductive adhesive, and electrons are emitted from the electrically conductive adhesive through field electron emission, to thereby prevent the potential of the electrically conductive structure from increasing in the negative direction.

11 Claims, 22 Drawing Sheets

OTHER PUBLICATIONS

B. K. Dichter et al.; High Voltage Frame and Differntial Charging Observed on a Geosynchronous Spacecraft; 6th Spacecraft Charging Technology Conference, AFRL-VS-TR-20001578, Sep. 1, 2000; pp. 329-333.

* cited by examiner

DISCHARGE MECHANISM (a) CHARGING (b) GENERATION OF ELECTRIC FIELD (c) DISCHARGE (d) BREAKDOWN

DISCHARGE PREVENTION MECHANISM (a) CHARGING, GENERATION OF ELECTRIC FIELD (b) RELAXATION OF ELECTRIC FIELD

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm

25 μm

ELECTRICALLY CONDUCTIVE PLATE 0.1～3.0mm

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm

25 μm 0.1～3.0mm

ELECTRICALLY CONDUCTIVE PLATE

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm

25 μm 1.0mm

ELECTRICALLY CONDUCTIVE PLATE

INSULATING FILM

ELECTRICALLY CONDUCTIVE PLATE (COLUMNAR PORTION)

ELECTRICALLY CONDUCTIVE PLATE (BASE PORTION)

INSULATING FILM

ELECTRICALLY CONDUCTIVE PLATE

INSULATING FILM

ELECTRICALLY
CONDUCTIVE PLATE
(BASE PORTION)

INSULATING FILM

25 μm 0.1～3.0mm

ELECTRICALLY
CONDUCTIVE PLATE

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm 0.1~3.0mm

ELECTRICALLY CONDUCTIVE PLATE

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm 0.1~3.0mm

ELECTRICALLY CONDUCTIVE PLATE

ELECTRICALLY CONDUCTIVE PLATE (BASE PORTION)

ELECTRICALLY CONDUCTIVE PLATE (COLUMNAR PORTION)

INSULATING FILM

ELECTRICALLY
CONDUCTIVE PLATE
(BASE PORTION)

ELECTRICALLY
CONDUCTIVE PLATE
(COLUMNAR PORTION)

INSULATING FILM

25 μm

50 μm 1.0mm

ELECTRICALLY
CONDUCTIVE
PLATE

INSULATING FILM

ELECTRICALLY
CONDUCTIVE PLATE
(BASE PORTION)

ELECTRICALLY
CONDUCTIVE PLATE
(COLUMNAR PORTION)

INSULATING FILM      25 μm      50 μm

25 μm 1.0mm

ELECTRICALLY
CONDUCTIVE
PLATE

INSULATING FILM

ELECTRICALLY
CONDUCTIVE PLATE
(BASE PORTION)

ELECTRICALLY
CONDUCTIVE
PLATE
(COLUMNAR PORTION)

0.1~1 mm 0.1 mm 1 mm

INSULATING FILM

25 μm

50 μm 1.0mm

ELECTRICALLY
CONDUCTIVE
PLATE

INSULATING FILM

ELECTRICALLY CONDUCTIVE PLATE (BASE PORTION)

ELECTRICALLY CONDUCTIVE PLATE (COLUMNAR PORTION)

INSULATING FILM

25 μm

50 μm 1.0 mm

ELECTRICALLY CONDUCTIVE PLATE

INSULATING FILM

ELECTRICALLY CONDUCTIVE PLATE (BASE PORTION)

ELECTRICALLY CONDUCTIVE PLATE (COLUMNAR PORTION)

INSULATING FILM

ELECTRICALLY CONDUCTIVE PLATE

ELECTRICAL DISCHARGE COUNTERMEASURE DEVICE

TECHNICAL FIELD

The present invention relates to an electrical discharge countermeasure device which is used for an electrically conductive structure, such as a geostationary orbit satellite or a polar orbit satellite, in an environment in which the electrically conductive structure is exposed to high-energy electrons, as well as for an electronic element attached on the surface thereof. The discharge countermeasure device prevents occurrence of electrical discharge on the electrically conductive structure or the electronic element, which electrical discharge would otherwise occur when the potential of the electrically conductive structure or the electronic element increases in the negative direction due to a negative charge flowing into the electrically conductive structure or the electronic element.

BACKGROUND ART

With an increase in electrical power of spacecraft in recent years, a phenomenon of electrical charge and discharge on a solar cell array of the spacecraft caused by space plasma has become a big problem. Since electrical power needed for realizing various functions of the spacecraft is obtained through solar-cell power generation, damage to the solar cell array caused by electrical discharge may result in total loss of the spacecraft. That is, avoiding electrical discharge at the solar cell array directly leads to an increase in the service life of the spacecraft.

FIG. 25 shows a schematic view of a spacecraft (satellite), and a detailed sectional view of a portion of a solar cell array thereof. The front surface of a panel to which solar cells are attached is covered almost entirely with an insulating tape. No insulating tape is bonded or welded to the back surface of the panel. The solar cell array is composed of a large number of solar cells (basic units) which are connected in series via inter connectors and each of which has electrodes attached to opposite sides thereof. The solar cells, whose front surfaces are covered with cover glasses (insulating material), are attached onto the structure of the spacecraft via an insulating tape. A spacecraft located in a geostationary orbit environment may encounter an unexpected substorm (magnetospheric substorm) generated due to solar activity in some times, and such a substorm is a main cause of a malfunction of the spacecraft. Electrons of high energy impinge on the spacecraft, and the spacecraft has a negative potential of a few kV or greater. As a result, the insulator on the surface of the spacecraft has a potential different from that of the spacecraft. An strong electric field is produced at a location (triple junction) on the surface of the spacecraft at which a vacuum, an insulator, and a conductor (which has the same potential as the spacecraft) meet, and an electrical discharge occurs. Many triple junctions are present on the solar cell array due to its structure, and an electrical discharge causes short-circuiting of a circuit, resulting in stoppage of supply of electrical power.

Non-Patent Document 1 discloses a technique of exposing a triple junction (location where an insulator and a conductor meet) to a space, to thereby emit electrons. However, Non-Patent Document 1 does not disclose concrete means.

Non-Patent Document 2 discloses a technique for preventing a satellite from acquiring a charge. Specifically, a charged state is detected by use of a charge sensor, and a high-density plasma is jetted to thereby increase the potential of the satellite, and eliminate potential differences between portions of the satellite. However, the employed control is basically an active control utilizing a sensor and a plasma injector, and therefore, a sensor, a power supply, a gas, etc. must be mounted on the satellite.

Patent Document 1 discloses a technique for controlling the potential of a satellite by use of a photocathode electrically connected to the satellite, and a light source for exciting the photocathode. However, this technique has a problem similar to that of the technique disclosed in Non-Patent Document 2.

Non-Patent Document 1: "Introducing The Passive Anode Surface Emission Cathode", D. Cooke et al., AIAA 2002-4049

Non-Patent Document 2: "High Voltage Frame and Differential Charging Observed on a Geosynchronous Spacecraft", B. K. Dichter et al., 6th Spacecraft Charging Technology Conference, 1998

Patent Document 1: Japanese Patent Application Laid-Open (kokai) No. H7-52900

DISCLOSURE OF THE INVENTION

Problem to be Solved by the Invention

An object of the present invention, which solves the above-mentioned problems, is to emit electrons from a spacecraft to the outside space, the amount of electrons corresponding to a negative charge flowing into the spacecraft, to thereby prevent charging more simply and at low cost, even when the spacecraft encounters a substorm (magnetospheric substorm) and electrons of high energy impinge on the spacecraft.

Means for Solving the Problem

An electrical discharge countermeasure device of the present invention prevents occurrence of electrical discharge on an electrically conductive structure in an environment in which high-energy electrons impinge onto the structure or on an electronic element mounted to a surface of the structure, which electrical discharge would otherwise occur when the potential of the structure or the electronic element increases in the negative direction due to a negative charge flowing thereinto. An insulating tape bonded to the surface of the electrically conductive structure is partially cut-removed; an electrically conductive adhesive is applied to an exposed portion of the surface of the electrically conductive structure to form a layer; and an insulating film or a plastic film reinforced by electrically conductive fibers is bonded to the layer of the electrically conductive adhesive, such that a portion of the layer of the electrically conductive adhesive is exposed to the outside. When the electrical discharge countermeasure device encounters higher-energy electrons, the insulating film or the plastic film reinforced by electrically conductive fibers is charged, so that a strong electric field is applied to the layer of the electrically conductive adhesive, and electrons are emitted from the electrically conductive adhesive through field electron emission, to thereby prevent the potential of the electrically conductive structure from increasing in the negative direction.

Further, another electrical discharge countermeasure device of the present invention is configured such that an electrically conductive plate, which is fixed to a surface of an insulating tape bonded to the surface of the electrically conductive structure and is electrically connected to the electrically conductive structure, is covered with an electrically conductive adhesive layer; and an insulating film or a plastic film reinforced by electrically conductive fibers is bonded to the layer of the electrically conductive adhesive, such that a portion of the layer of the electrically conductive adhesive is exposed to the outside.

Each of the insulating tape and the insulating film is formed of a polyimide-based polymer material, and the electrically conductive adhesive is a carbon-based adhesive. The portion of the layer of the electrically conductive adhesive exposed to the outside may be an edge portion of the layer of the electrically conductive adhesive located around the insulating film or the plastic film reinforced by electrically conductive fibers, an electrically conductive rod inserted into a hole of the insulating film and bonded to the electrically conductive adhesive layer, a hole formed in the insulating film, or a combination thereof.

Further, another electrical discharge countermeasure device of the present invention is configured such that an insulating tape bonded to the surface of the electrically conductive structure is partially cut-removed; an electrically conductive adhesive is applied to an exposed portion of the surface of the electrically conductive structure to form a layer; and an electrically conductive plate which is electrically connected to the electrically conductive structure via the electrically conductive adhesive is fixed to the surface of the insulting tape. An insulating film or a plastic film reinforced by electrically conductive fibers is bonded to an upper surface of the electrically conductive plate such that a portion of the upper surface is exposed to the outside. When the electrical discharge countermeasure device encounters higher-energy electrons, the insulating film or the plastic film reinforced by electrically conductive fibers is charged, so that a strong electric field is applied to the electrically conductive plate, and electrons are emitted from the electrically conductive plate through field electron emission, to thereby prevent the potential of the electrically conductive structure from increasing in the negative direction.

Effects of the Invention

According to the present invention, charging prevention can be accomplished more simply and at lower cost, without requiring a power source or a gas for emitting electrons. Further, since electron emission starts simultaneously with charging of an insulator on the outer side of a spacecraft, the insulator itself plays a role of a charge sensor. Therefore, a sensor incorporating an electronic circuit therein is not needed.

Currently, cost of power supply equipment, such as solar cell arrays and batteries, accounts for half or more of insurance claims associated with malfunctions of geostationary orbit satellites. A considerable portion of the malfunctions is caused by charging of the satellites. The present invention prevents charging through a simple method, to thereby greatly contribute to an improvement of the reliability of satellites.

BRIEF DESCRIPTION OF THE DRAWINGS

FIG. 3A and FIG. 3B are a pair of views showing the details of the electrical discharge countermeasure device according to the first embodiment, wherein FIG. 3A is a perspective view of the device, and FIG. 3B is a cross-sectional view of the device.

FIG. 5A and FIG. 5B are a pair of views showing the details of an electrical discharge countermeasure device according to a second embodiment, wherein FIG. 5A is a perspective view of the device, and FIG. 5B is a cross-sectional view of the device.

FIG. 6A and FIG. 6B are a pair of views showing the details of an electrical discharge countermeasure device according to a third embodiment, wherein FIG. 6A is a perspective view of the device, and FIG. 6B is a cross-sectional view of the device.

FIG. 7A and FIG. 7B are a pair of views showing the details of an electrical discharge countermeasure device according to a fourth embodiment, wherein FIG. 7A is a perspective view of the device, and FIG. 7B is a cross-sectional view of the device.

FIG. 8A and FIG. 8B are a pair of views showing the details of an electrical discharge countermeasure device according to a fifth embodiment, wherein FIG. 8A is a perspective view of the device, and FIG. 8B is a cross-sectional view of the device.

FIG. 9A and FIG. 9B are a pair of views showing the details of an electrical discharge countermeasure device according to a sixth embodiment, wherein FIG. 9A is a perspective view of the device, and FIG. 9B is a cross-sectional view of the device.

FIG. 10A and FIG. 10B are a pair of views, wherein FIG. 10A is a cross-sectional view showing the details of an electrical discharge countermeasure device according to a seventh embodiment, and FIG. 10B is a cross-sectional view showing a testing apparatus for the device.

FIGS. 11A-11C are a set of views, wherein FIG. 11A is a perspective view showing the arrangement of an electrically conductive plate and an insulating film thereon, which are shown in FIG. 10, FIG. 11B is a top view of an electrically conductive plate columnar portion and its vicinity of FIG. 11A within a circle, and FIG. 11C is a cross-sectional view showing example dimensions.

FIGS. 12A-12C are a set of views, wherein FIG. 12A is a perspective view showing the details of an electrical discharge countermeasure device according to an eighth embodiment, FIG. 12B is a top view of an electrically conductive plate columnar portion and its vicinity of FIG. 12A within a circle, and (C) is a cross-sectional view showing example dimensions.

FIGS. 13A-13C are a set of views, wherein FIG. 13A is a perspective view showing the details of an electrical discharge countermeasure device according to a ninth embodiment, FIG. 13B is a top view of an electrically conductive plate columnar portion and its vicinity of FIG. 13A within a circle, and FIG. 13C is a cross-sectional view showing example dimensions.

FIGS. 14A-14C are a set of views, wherein FIG. 14A is a perspective view showing the details of an electrical discharge countermeasure device according to a tenth embodiment, FIG. 14B is a top view of an electrically conductive plate columnar portion and its vicinity of FIG. 14A within a circle, and FIG. 14C is a cross-sectional view showing example dimensions.

FIGS. 15A-15C are a set of views, wherein FIG. 15A is a perspective view showing the details of an electrical discharge countermeasure device according to an eleventh embodiment, FIG. 15B is a top view of an electrically conductive plate columnar portion and its vicinity of FIG. 15A within a circle, and FIG. 15C is a cross-sectional view showing example dimensions.

FIGS. 16A-16C are a set of views, wherein FIG. 16A is a perspective view showing the details of an electrical discharge countermeasure device according to a twelfth embodiment, FIG. 16B is a top view of an electrically conductive plate columnar portion and its vicinity of FIG. 16A within a circle, and FIG. 16C is a cross-sectional view showing example dimensions.

FIGS. 17A-17C are a set of views, wherein FIG. 17A is a perspective view showing the details of an electrical discharge countermeasure device according to a thirteenth eleventh embodiment, FIG. 17B is a top view of an electrically conductive plate columnar portion and its vicinity of FIG. 17A within a circle, and FIG. 17C is a cross-sectional view showing example dimensions.

FIGS. 18A-18C is a set of views, wherein FIG. 18A is a perspective view showing the details of an electrical discharge countermeasure device according to a fourteenth embodiment, FIG. 18B is a top view of an electrically conductive plate columnar portion and its vicinity of FIG. 18A within a circle, and FIG. 18C is a cross-sectional view showing example dimensions.

FIGS. 19A-19C is a set of views, wherein FIG. 19A is a perspective view showing the details of an electrical discharge countermeasure device according to a fifteenth embodiment, FIG. 19B is a top view of an electrically conductive plate columnar portion and its vicinity of FIG. 19A within a circle, and FIG. 19C is a cross-sectional view showing example dimensions.

FIGS. 20A-20C are a set of views, wherein FIG. 20A is a perspective view showing the details of an electrical discharge countermeasure device according to a sixteenth embodiment, FIG. 20B is a top view of an electrically conductive plate columnar portion and its vicinity of FIG. 20A within a circle, and FIG. 20C is a cross-sectional view showing example dimensions.

FIGS. 21A-21C is a set of views, wherein FIG. 21A is a perspective view showing the details of an electrical discharge countermeasure device according to a seventeenth embodiment, FIG. 21B is a top view of an electrically conductive plate columnar portion and its vicinity of FIG. 21A within a circle, and FIG. 21C is a cross-sectional view showing example dimensions.

FIGS. 22A-22C are a set of views, wherein FIG. 22A is a perspective view showing the details of an electrical discharge countermeasure device according to an eighteenth embodiment, FIG. 22B is a top view of an electrically conductive plate columnar portion and its vicinity of FIG. 22A within a circle, and FIG. 22C is a cross-sectional view showing example dimensions.

FIGS. 23A-23C are a set of views, wherein FIG. 23A is a perspective view showing the details of an electrical discharge countermeasure device according to a nineteenth embodiment, FIG. 23B is a top view of an electrically conductive plate columnar portion and its vicinity of FIG. 23A within a circle, and FIG. 23C is a cross-sectional view showing example dimensions.

BEST MODE FOR CARRYING OUT THE INVENTION

If a spacecraft (satellite) encounters high-energy electrons along an orbit, the potential of the spacecraft greatly increases in the negative direction, and a large potential difference is generated between the spacecraft and an insulator on the surface of the spacecraft. If the potential difference exceeds a certain threshold, an electrical discharge occurs, which may result in deterioration of the surface, generation of electromagnetic noise, and breakdown of components, ending up with total loss of the functions of the spacecraft. When the surface potential of the insulator is positive in relation to that of the spacecraft, the threshold at which discharge occurs is as low as a few hundreds V. Therefore, countermeasures are needed.

Figure 1:
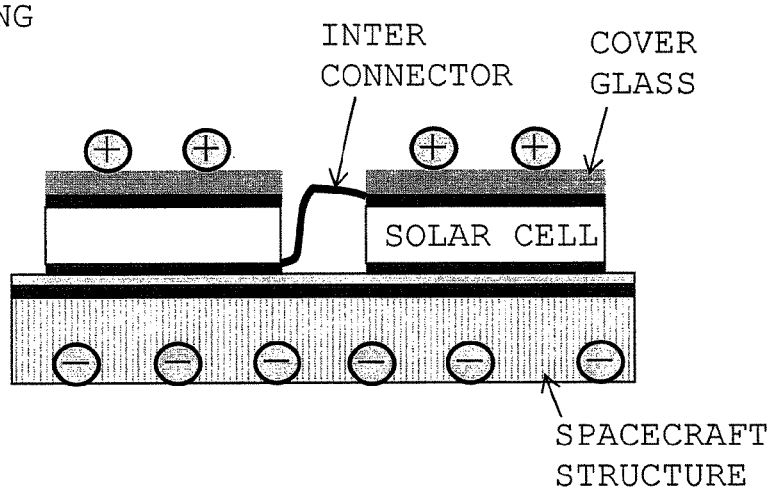
FIG. 1 is a set of views showing a discharge mechanism.
Figure 1:
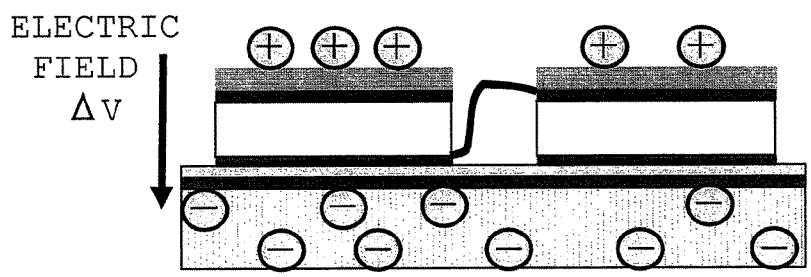
Figure 1:
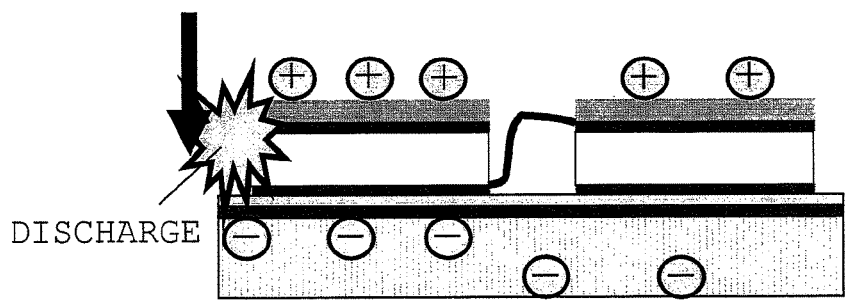
Figure 1:
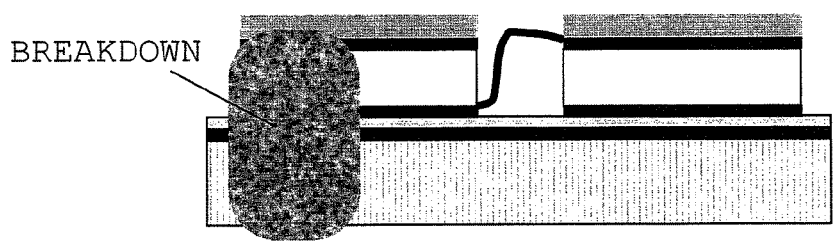

FIG. 1 is a set of views showing a discharge mechanism. FIG. 1(a) shows a state in which a spacecraft has encountered high-energy electrons, and has been charged to assume a large negative potential. When the potential of the entire spacecraft becomes negative, insulators (cover glasses) and conductor portions (electrodes of solar cells, inter connectors, the spacecraft structure) are charged differently because of the difference of materials, and a difference in charge is produced between the insulators and the conductor portions.

FIG. 1(b) shows generation of an electric field (DV) attributable to the difference in charge. Thus, as shown in FIG. 1(c), an electrical discharge occurs as a result of rapid acceleration of the electric field. Then, as shown in FIG. 1(d), the discharge deteriorates and carbonizes the materials, whereby generation of electrical power becomes impossible.

Occurrence of discharge can be prevented by means of preventing the spacecraft from being charged to a negative potential by high-energy electrons. Such charging can be prevented by emitting, from the spacecraft to the outside space, electrons whose amount corresponds to a negative charge flowing into the spacecraft.

Figure 2:
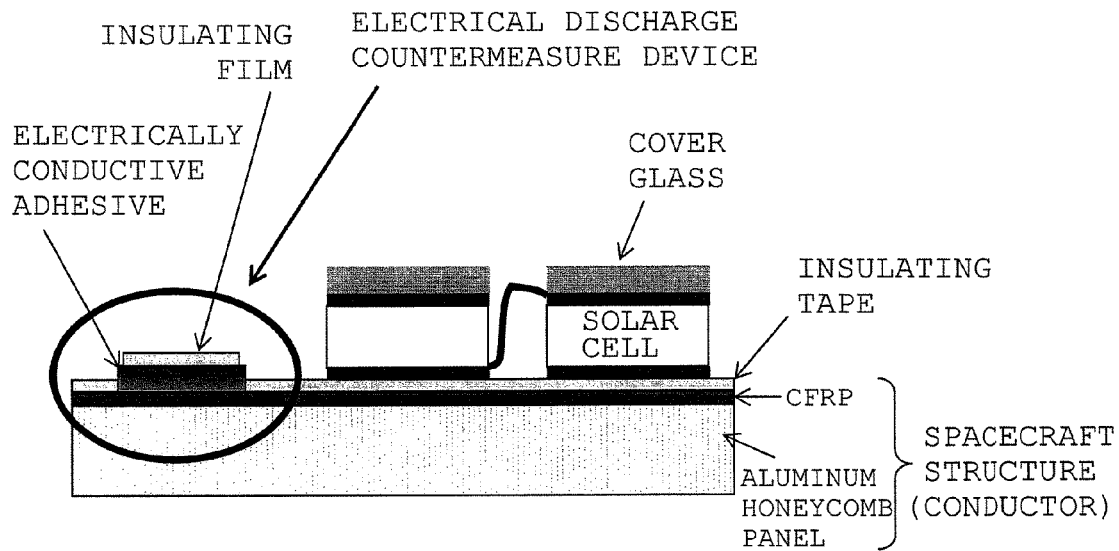
FIG. 2 is a view showing an electrical discharge countermeasure device according to a first embodiment, which is provided on an external conductor surface of a spacecraft.
Figure 3A:
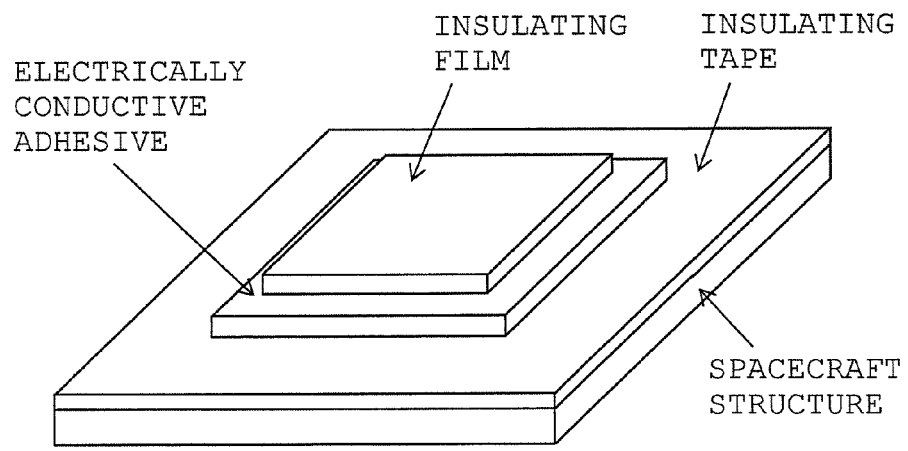
Figure 3B:
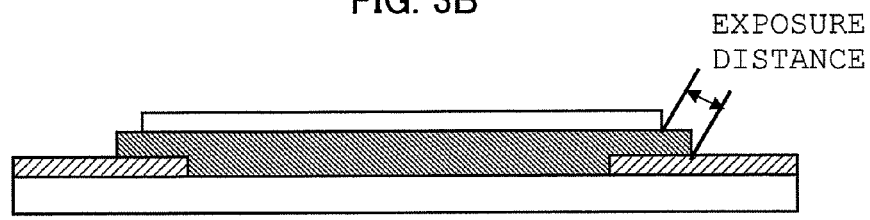

FIG. 2 is a view showing an electrical discharge countermeasure device according to a first embodiment, which is provided on an external conductor surface of the spacecraft. FIG. 3A and FIG. 3B are a pair of views showing the details of the electrical discharge countermeasure device according to the first embodiment, wherein FIG. 3A is a perspective view of the device, and FIG. 3B is a cross-sectional view of the device. As shown in these drawings, a square polyimide-based polymer tape (insulating film) having a size of a few centimeters×a few centimeters is thermally fused (or bonded) to the spacecraft structure (conductor). As shown in FIG. 2, the spacecraft structure is composed of an aluminum honeycomb panel and CFRP (carbon-fiber-reinforced plastic: conductor) formed thereon. In general, a solar cell panel (spacecraft structure to which solar cells are mounted); specifically, the entirety of a mounting surface thereof, is covered with an insulating film in order to provide insulation between the spacecraft structure and the solar cells.

A central portion of the insulating film is cut-removed, and an electrically conductive (carbon-based) adhesive is applied to an exposed portion of the conductive surface, as a conductor. An insulator (e.g., polyimide-based polymer) film is also bonded onto the carbon-based adhesive layer such that an edge of the adhesive layer; i.e., edge portions of the upper surface of the adhesive located around the polyimide-based polymer film, are exposed to the outside. As shown in FIG. 3B, the electrically conductive adhesive layer is formed to overlap the underlying insulating tape. However, the electrically conductive adhesive layer is not necessarily required to be formed on the underlying insulating tape; it is sufficient for the electrically conductive adhesive layer to be connected to the conductor (spacecraft structure). However, if a portion of the conductor surface in the area where the tape is cut-removed is exposed to the outside, discharge becomes more likely to occur. Therefore, the conductor surface in that area is completely covered with the electrically conductive adhesive.

As described above, the electrically conductive adhesive layer is sandwiched between the upper and lower insulating films (tapes) such that the edge portions of the upper surface are exposed to the outside. Thus, when the spacecraft encounters high-energy electrons along an orbit, the polymer film is charged, so that a strong electric field is applied to the surface of the carbon-based adhesive layer. Through field electron emission, electrons are emitted from the adhesive layer, resulting in emission of current which balances with high-energy electrons flowing into the other portions of the spacecraft, whereby the potential of the spacecraft increases in the positive direction. Notably, when the distance (exposure distance) between the insulating film and the edge of the adhesive layer is increased excessively, electron emission does not occur (in a trial manufacture and experiment, no electron emission occurred when the exposure distance was 1.58 mm or greater).

Figure 4:
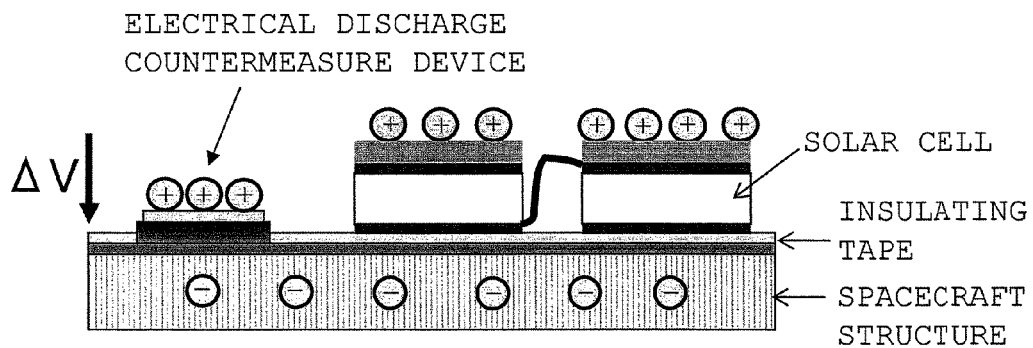
FIG. 4 is a set of views showing a discharge prevention mechanism.
Figure 4:
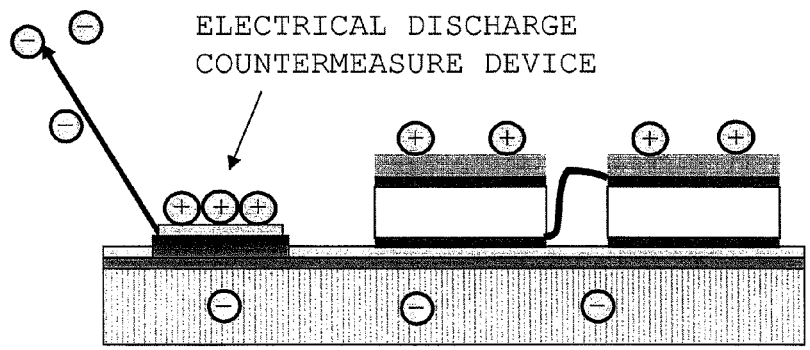

FIG. 4 is a set of views showing a discharge prevention mechanism. FIG. 4(a) is a view showing charging and generation of an electric field. As having been described with reference to FIG. 1, when the potential of the entire spacecraft becomes negative, insulators (cover glasses) and conductor portions (electrodes of solar cells, connectors, the structure of the spacecraft) are charged differently because of the difference of materials, and a difference in charge is produced between the insulators and the conductor portions.

FIG. 4(b) is a view showing relaxation of the electric field. Since the electric field formed through charging triggers emission of electrons, the potential of the conductor portions changes toward the positive direction, so that the potential difference decreases. The present method requires neither a power source nor a gas for emitting electrons. Further, since the emission of electrons starts simultaneously with charging of the insulator on the outer side of the electrical discharge countermeasure device, the insulator itself plays a role of a charge sensor. Therefore, a sensor incorporating an electronic circuit therein is not needed. A test calculation shows that charging of an ordinary geostationary-orbit commercial satellite can be prevented by merely bonding about 100 emission portions to various portions of the satellite, the emission portions each having a size of a few centimeters×a few centimeters.

Figure 5A:
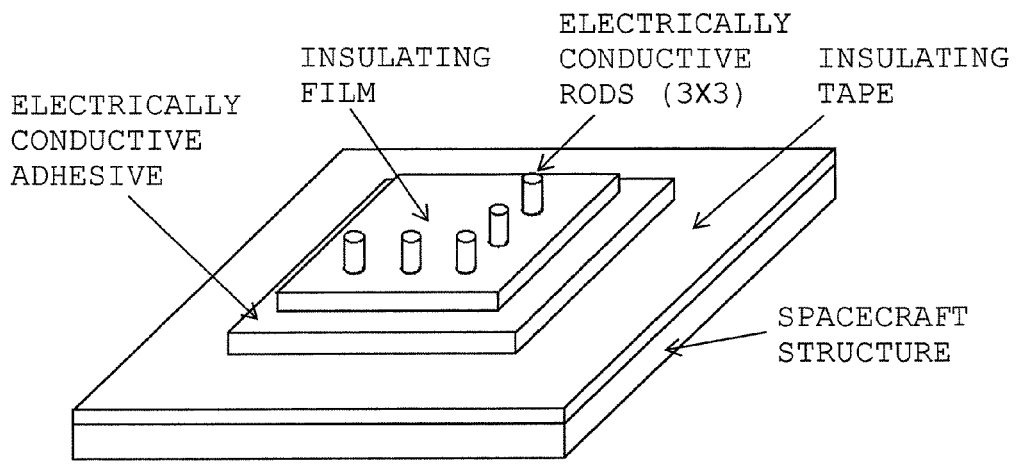
Figure 5B:
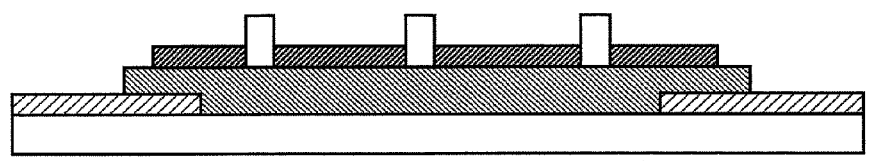

FIG. 5A and FIG. 5B are a pair of views showing the details of an electrical discharge countermeasure device according to a second embodiment, wherein FIG. 5A is a perspective view of the device, and FIG. 5B is a cross-sectional view of the device. As shown in these drawings, a plurality of holes are formed in the insulating film at equal intervals along two directions orthogonal to each other. Electrically conductive rods (in a trial manufacture and test, leads for mechanical pencils having a diameter of 0.5 mm and a length of about 5 mm were used) are inserted into the holes, and bonded to the electrically conductive adhesive layer. The remaining portions are the same as the first embodiment. The label "electrically conductive rods (3×3)" in FIG. 5A indicates that the electrical discharge countermeasure device was manufactured on a trial basis with nine electrically conductive rods provided. However, in order to prevent the drawing from becoming complex, four electrically conductive rods are omitted from the drawing. In the trial manufacture and experiment, electrons were emitted from the electrically conductive rods as well.

Figure 6A:
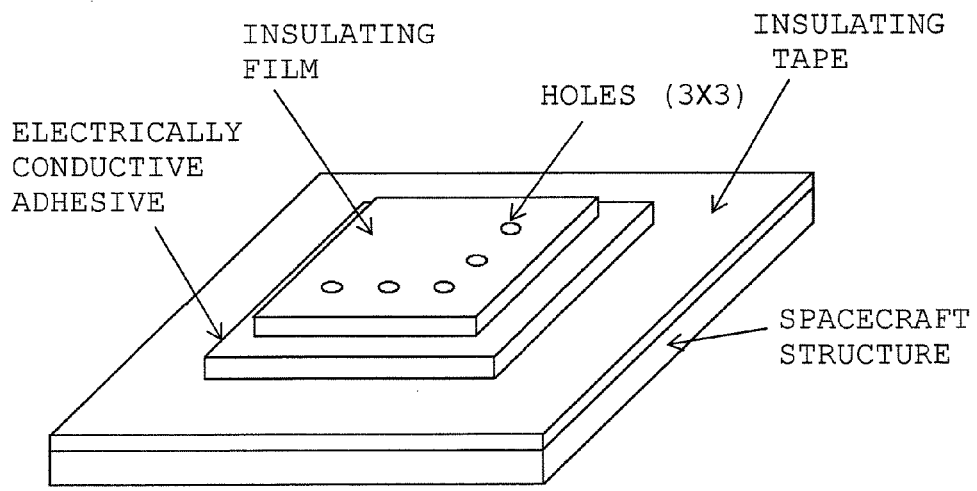
Figure 6B:
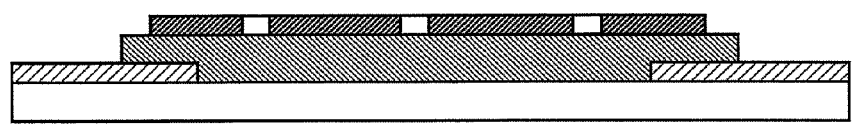

FIG. 6A and FIG. 6B are a pair of views showing the details of an electrical discharge countermeasure device according to a third embodiment, wherein FIG. 6A is a perspective view of the device, and FIG. 6B is a cross-sectional view of the device. A plurality of holes (e.g., those having a diameter of 0.5 mm) are formed in the insulating film of the first embodiment (FIG. 3A and FIG. 3B) at equal intervals along two directions orthogonal to each other. The label "holes (3×3)" in FIG. 6A indicates that the electrical discharge countermeasure device was manufactured on a trial basis with nine holes provided. However, in order to prevent the drawing from becoming complex, four holes are omitted from the drawing. In the trial manufacture and experiment, electrons were emitted from the holes as well.

Figure 7A:
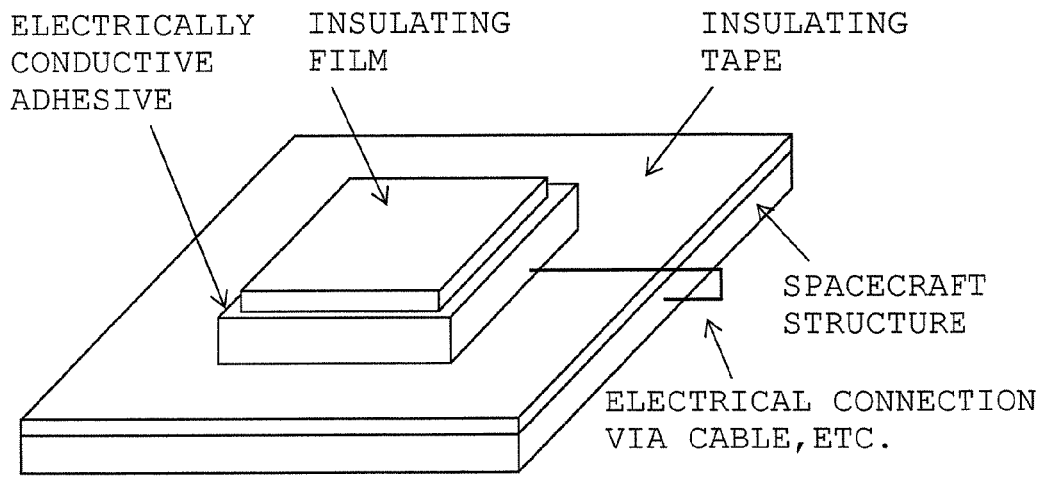
Figure 7B:
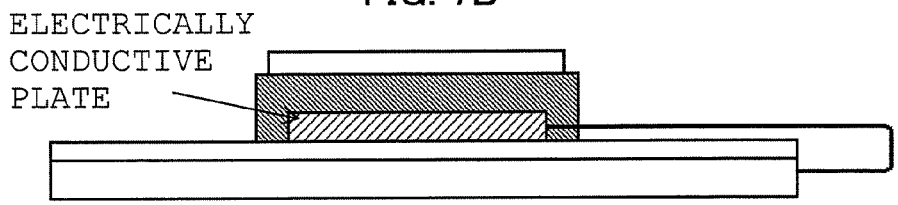

FIG. 7A and FIG. 7B are a pair of views showing the details of an electrical discharge countermeasure device according to a fourth embodiment, wherein FIG. 7A is a perspective view of the device, and FIG. 7B is a cross-sectional view of the device. These drawings show an example in which the electrical discharge countermeasure device is attached to the surface of the spacecraft structure without cutting the insulating tape for partial removal thereof. An electrically conductive plate is fixed onto the surface of the insulating tape by means of adhesive or the like, and is electrically connected to the spacecraft (conductor) by use of a cable or the like. The surface of the electrically conductive plate is covered with an electrically conductive adhesive having a conductivity (about $\frac{1}{10^8}$ to $\frac{1}{10^9}$) lower than that of copper, thereby preventing occurrence of electrical short circuit between the electrically conductive plate and other conductors such as solar cells. Since discharge easily occurs if the edge of the electrically conductive plate is exposed, the electrically conductive plate is completely covered with the electrically conductive adhesive.

Figure 8A:
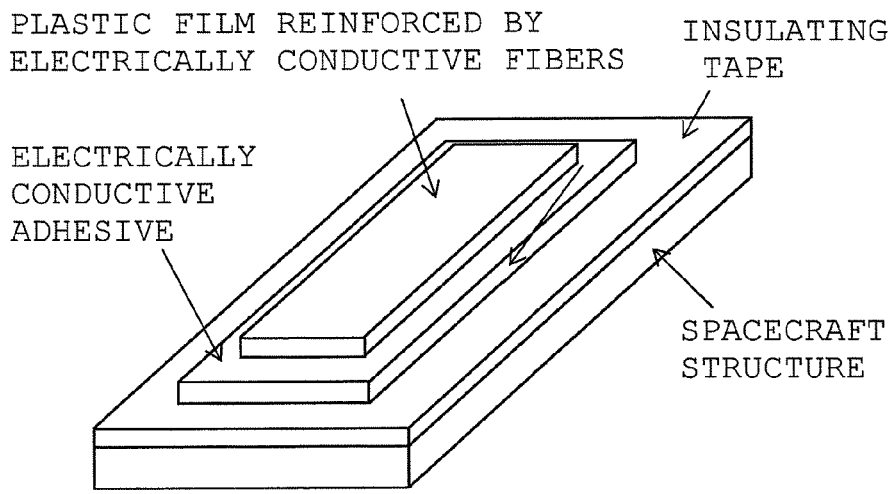
Figure 8B:
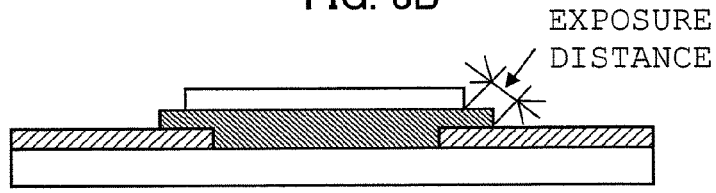

FIG. 8A and FIG. 8B are a pair of views showing the details of an electrical discharge countermeasure device according to a fifth embodiment, wherein FIG. 8A is a perspective view of the device, and FIG. 8B is a cross-sectional view of the device. In this embodiment, a plastic film reinforced by electrically conductive fibers is used in place of the insulating film of the first embodiment (FIG. 3A and FIG. 3B). The electrical discharge countermeasure device was manufactured on a trial basis by using a film of CFRP (carbon-fiber-reinforced plastic using an epoxy-based resin; thickness: 0.1 to 0.2 mm) as the plastic film reinforced by electrically conductive fibers, as well as an insulating tape (kapton (polyimide base); thickness: 0.063 mm) and an electrically conductive adhesive (s692; applied to a thickness of about 0.1 mm). The resistivity of the electrically conductive adhesive (s692) is about 100 to 1000 ohm*cm, which is about $\frac{1}{10^8}$ to $\frac{1}{10^9}$ that of copper. CFRP is formed by binding carbon fibers (conductor having a resistivity about 10 to 100 times that of copper) with a resin whose resistivity is about $10^{20}$ times that of copper. The portion formed of the resin contributes to charging as in the case of the insulating film of FIG. 3A and FIG. 3B.

The function of the electrical discharge countermeasure device of the present embodiment is equivalent to that of the electrical discharge countermeasure device of the first embodiment. However, in contrast to the insulating film whose dimension control is difficult, the CFPR film has a merit of high dimensional accuracy. In particular, when the CFRP film is cut into small strips, it has a merit of increasing the area in which field emission occurs. As in the case of the first embodiment, a slight projection of the electrically conductive adhesive layer does not affect the electron emission. However, if the distance between the plastic film reinforced by electrically conductive fibers and the edge of the electrically conductive adhesive layer becomes 1.58 mm or greater, electron emission does not occur. Therefore, the distance is preferably controlled to fall within a range of about 0.1 to about 1 mm. In the trial manufacture and experiment, electric field emission was observed for two samples which differ in the size of the plastic film reinforced by electrically conductive fibers (98 mm×40 mm and 40 mm×5 mm).

Figure 9A:
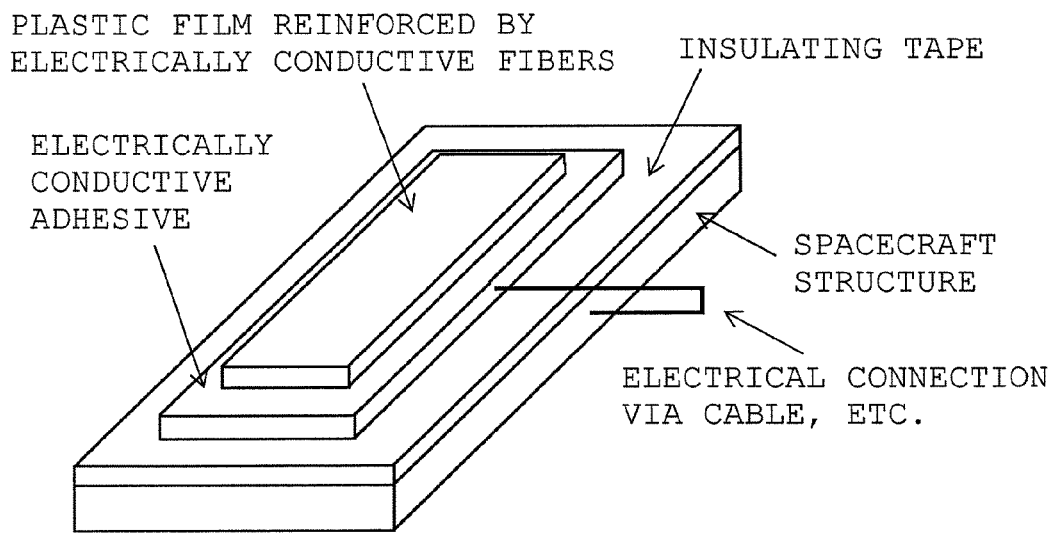
Figure 9B:
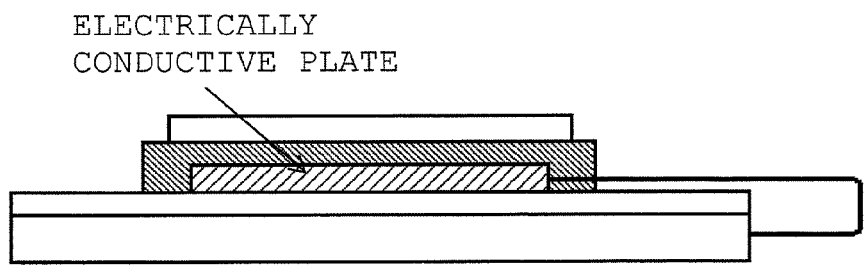

FIG. 9A and FIG. 9B are a pair of views showing the details of an electrical discharge countermeasure device according to a sixth embodiment, wherein FIG. 9A is a perspective view of the device, and FIG. 9B is a cross-sectional view of the device. This embodiment is a modification of the fifth embodiment (FIG. 8A and FIG. 8B). The present embodiment shows an example in which the electrical discharge countermeasure device is attached to the surface of the spacecraft structure without cutting the insulating tape for partial removal thereof. As in the case of FIG. 7A and FIG. 7B, an electrically conductive plate is fixed onto the surface of the insulating tape by means of adhesive or the like, and is electrically connected to the spacecraft structure by use of a cable or the like. The surface of the electrically conductive plate is covered with an electrically conductive adhesive having a conductivity (about $1/10^8$ to $1/10^9$) lower than that of copper, whereby occurrence of discharge between the electrically conductive plate and other conductors such as solar cells can be prevented.

Figure 10A:
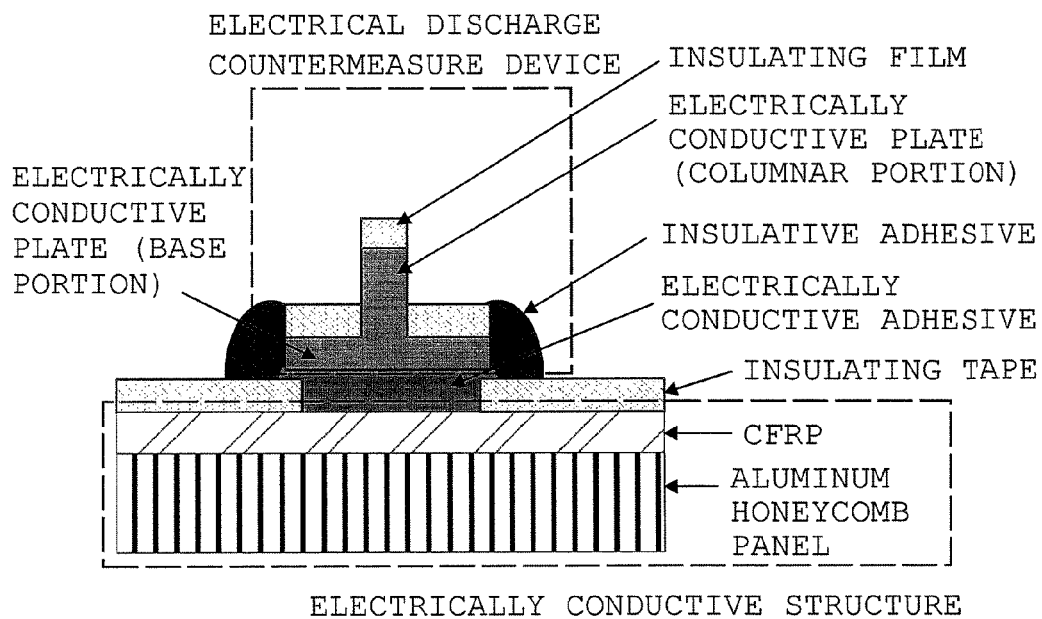
Figure 10B:
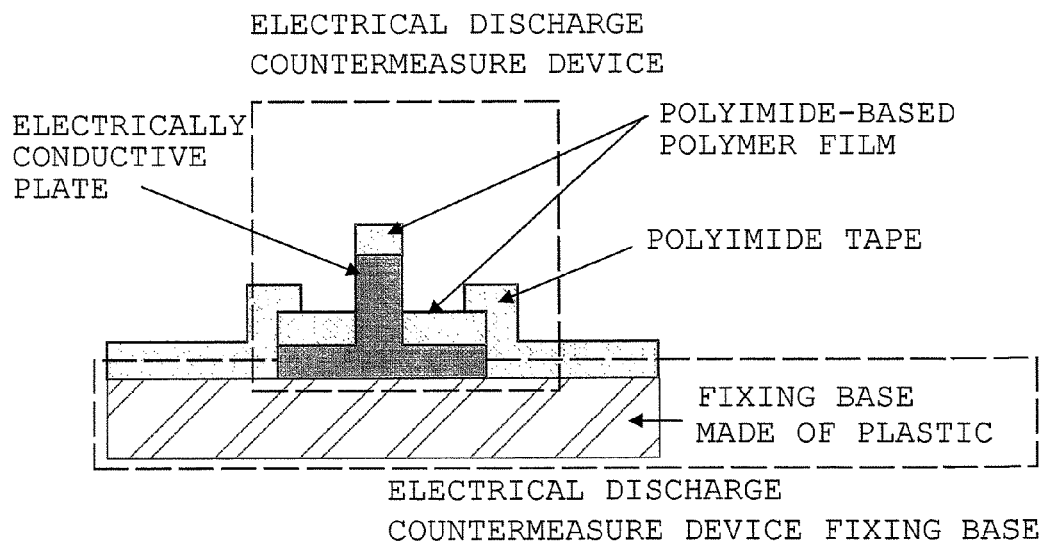
Figure 11A:
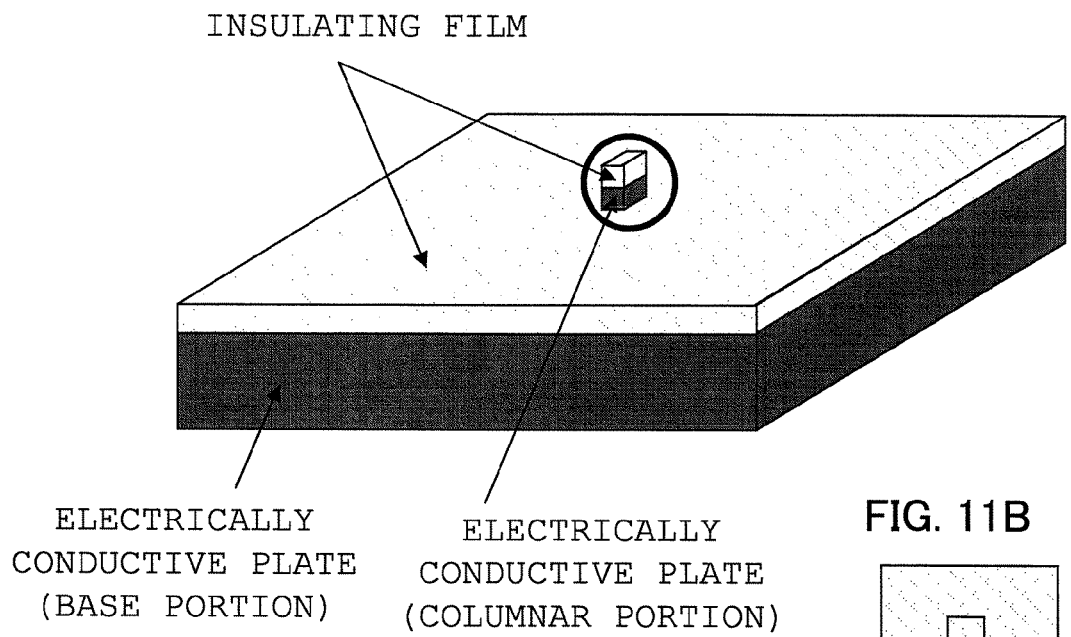
Figure 11B:
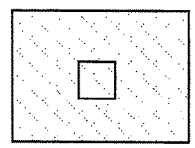
Figure 11C:
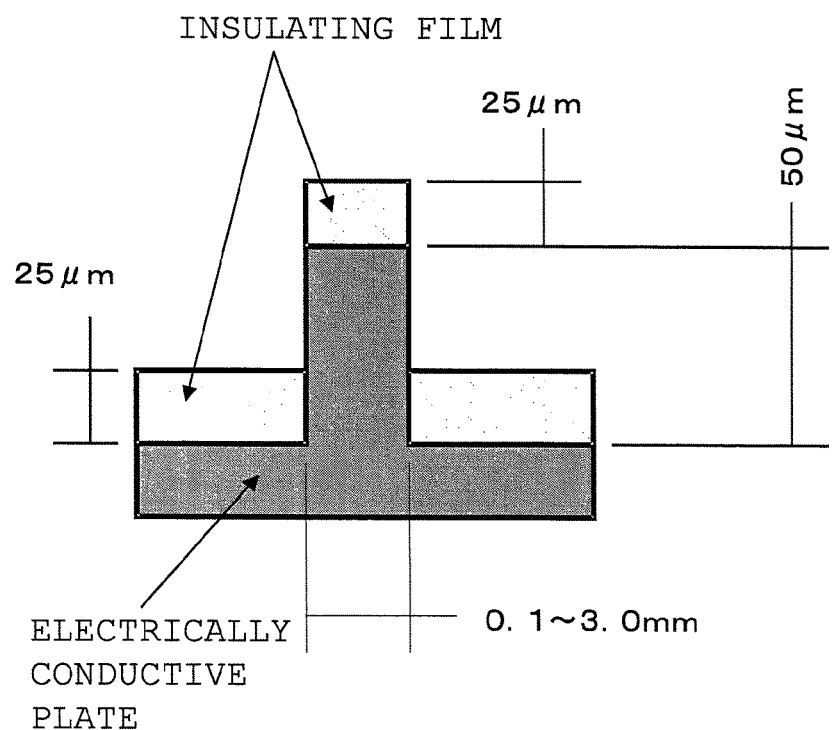

FIG. 10A and FIG. 10B are a pair of views, wherein FIG. 10A is a cross-sectional view showing the details of an electrical discharge countermeasure device according to a seventh embodiment, and FIG. 10B is a cross-sectional view showing a testing apparatus for the device. FIGS. 11A-11C are a set of views, wherein FIG. 11A is a perspective view showing the arrangement of an electrically conductive plate and an insulating film thereon, which are shown in FIG. 10, FIG. 11B is a top view of an electrically conductive plate columnar portion and its vicinity of FIG. 11A within a circle, and FIG. 11C is a cross-sectional view showing example dimensions. The seventh embodiment shows an example in which the electrical discharge countermeasure device is attached to an electrically conductive structure, which is composed of an aluminum honeycomb panel and a CFRP film, while an insulating tape (polyimide-based polymer tape) thermally fused (or bonded) to the surface of the electrically conductive structure is partially cut-removed.

The insulating tape bonded to the surface of the electrically conductive structure is partially cut-removed; an conductive adhesive is applied to an exposed surface of the electrically conductive structure; and an electrically conductive plate is fixed to the surface of the insulating tape. Thus, the electrically conductive plate is electrically connected to the electrically conductive structure via the electrically conductive adhesive. The electrically conductive plate includes a flat-plate-shaped base portion and a columnar portion extending vertically upward from a central portion of the base portion. The material of the electrically conductive plate may be a metal or an electrically conductive synthetic resin. Since the electrically conductive plate is small in dimension (in particular, thickness), the electrically conductive plate is desired that it can be fabricated easily. Since the electrically conductive plate of the present embodiment is simple in structure, it can be manufactured with high dimensional accuracy and high yield. Accordingly, the electrically conductive plate has various merits such as lowing production cost. Further, the stability of the surface is high, and therefore, the electrically conductive plate is advantageous from the viewpoints of degradation and change of properties.

As shown in FIGS. 10 and 11, the columnar portion extends from the base portion of the electrically conductive plate, which the lowermost layer, through the insulating film, so that the distal end thereof is exposed to the outside. Instead of the insulating film, a plastic film reinforced by electrically conductive fibers can be used. The base portion of the electrically conductive plate is a portion which is fixed to the electrical conductive structure, and the columnar portion of the electrically conductive plate is a portion which contributes to electron emission. An insulating film (polyimide-based polymer film) is thermally fused (or bonded) to the upper surfaces of the base portion and columnar portion of the electrically conductive plate. As shown in FIG. 11B, the columnar portion of the electrically conductive plate has a square shape (or rectangular shape) as viewed from above. The side surfaces of the base portion of the electrically conductive plate, along with the side surfaces of the insulating film on the upper surface of the base portion, are bonded to the insulating tape on the upper surface of the electrically conductive structure by means of an insulative adhesive. Thus, the upper surface of the insulating tape on the upper surface of the electrically conductive structure, the side surfaces of the base portion of the electrically conductive plate, and the side surfaces of the insulating film provided on the base portion are bonded together, and exposure of the side surfaces of the base portion of the electrically conductive plate can be prevented. Only the side surfaces of the columnar portion of the electrically conductive plate are exposed to the outside space.

The performance of the electrical discharge countermeasure device of the seventh embodiment was checked by use of a testing apparatus shown FIG. 10B. In the testing apparatus, the electrically conductive plate is placed on a fixing base made of plastic, rather than an electrically conductive structure. A satellite potential is applied to the electrically conductive plate by use of a cable. Further, the side surfaces of the base portion of the electrically conductive plate are covered by a polyimide-based polymer tape, rather than the electrically conductive adhesive. As a result of performing a test by use of such a testing apparatus, actual emission of electrons was confirmed.

Figure 12A:
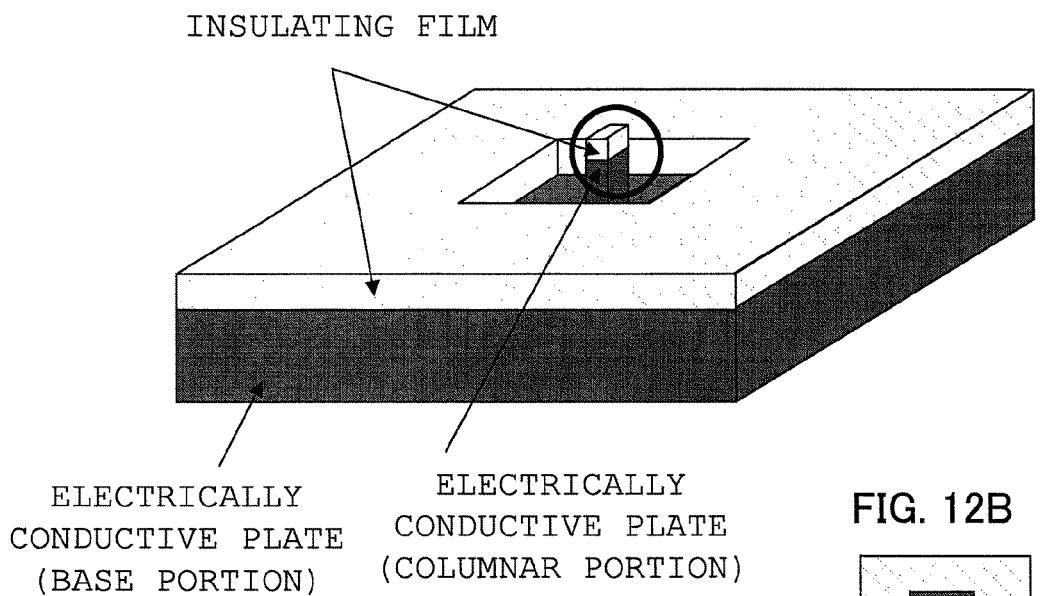
Figure 12B:
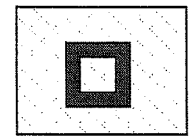
Figure 12C:
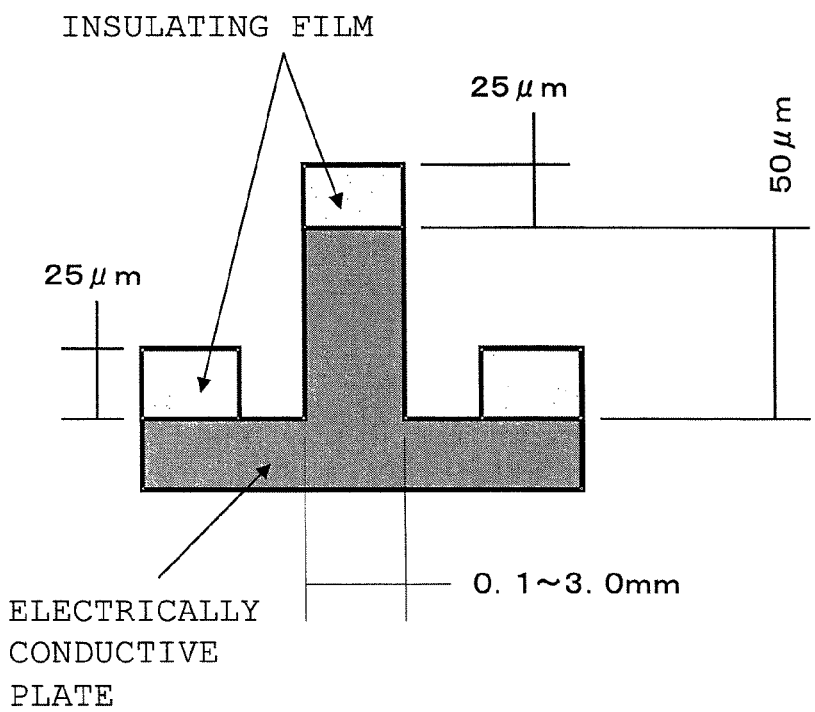

FIGS. 12A-12C are a set of views, wherein FIG. 12A is a perspective view showing the details of an electrical discharge countermeasure device according to an eighth embodiment, FIG. 12B is a top view of an electrically conductive plate columnar portion and its vicinity of FIG. 12A within a circle, and FIG. 12C is a cross-sectional view showing example dimensions. The electrical discharge countermeasure device of the present embodiment is identical in structure with that of the seventh embodiment shown in FIG. 11, except that the insulating film is cut-removed in an area around the columnar portion of the electrically conductive plate. By virtue of this configuration, not only all the side surfaces of the columnar portion but also a portion of the upper surface of the base portion of the electrically conductive plate, the portion being continuous with the side surfaces, are exposed to the outside space, without being covered with the insulating film. For the electrical discharge countermeasure device of the eighth embodiment, actual emission of electrons was confirmed by use of the testing apparatus.

Figure 13A:
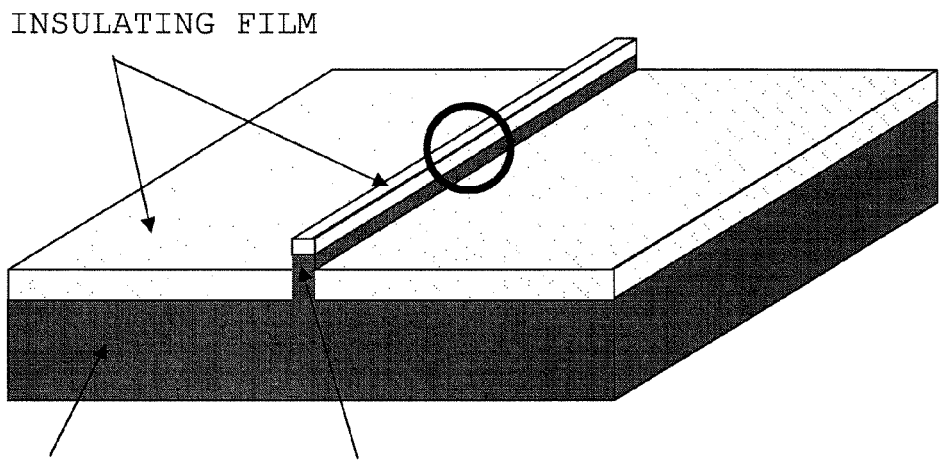
Figure 13B:
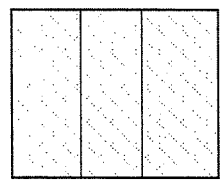
Figure 13C:
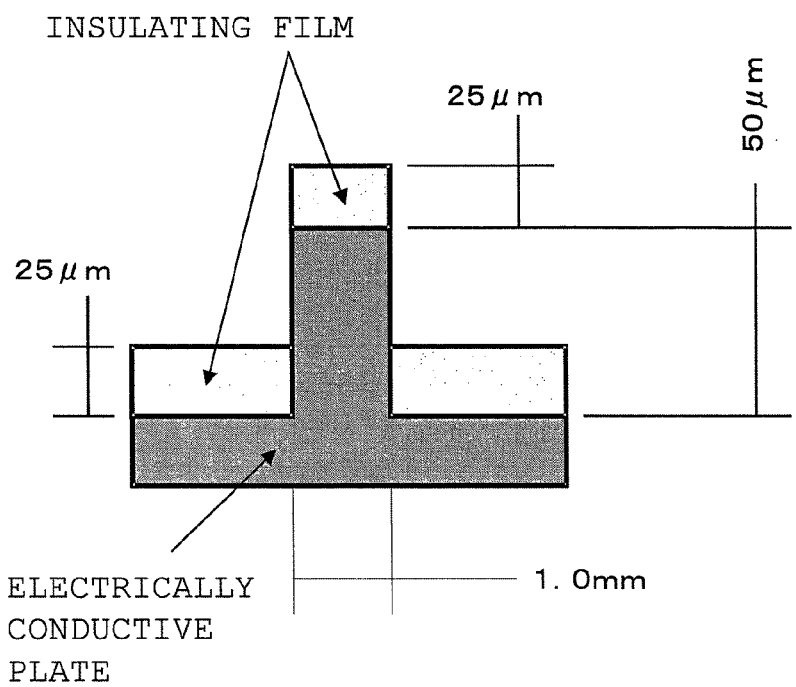

FIGS. 13A-13C is a set of views, wherein FIG. 13A is a perspective view showing the details of an electrical discharge countermeasure device according to a ninth embodiment, FIG. 13B is a top view of an electrically conductive plate columnar portion and its vicinity of FIG. 13A within a circle, and FIG. 13C is a cross-sectional view showing example dimensions. The electrical discharge countermeasure device of the present embodiment is identical in structure with that of the seventh embodiment shown in FIG. 11, except that the columnar portion of the electrically conductive plate is formed to have a straightly elongated shape, and side surfaces thereof are exposed to the outside space.

Figure 14A:
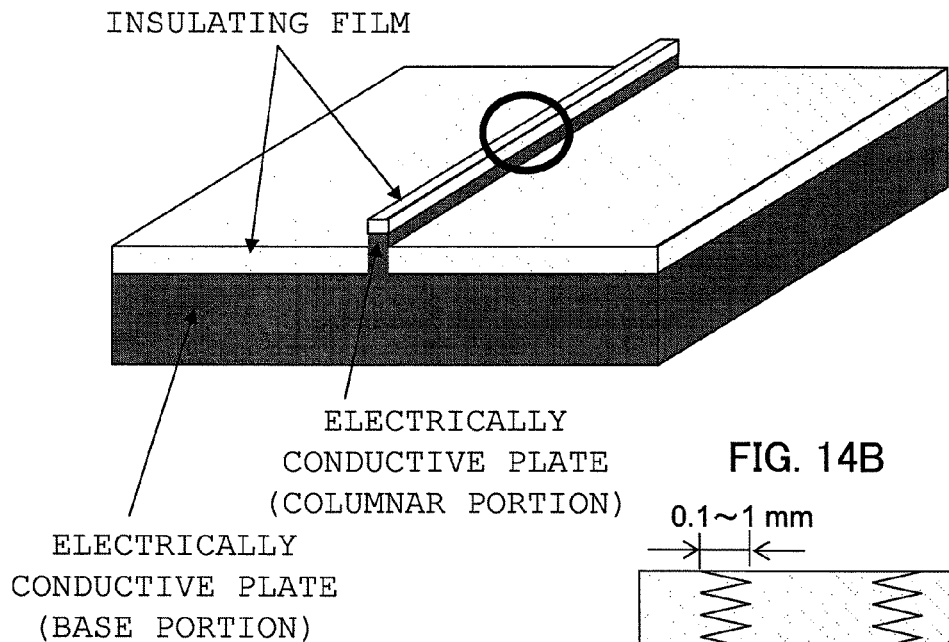
Figure 14B:
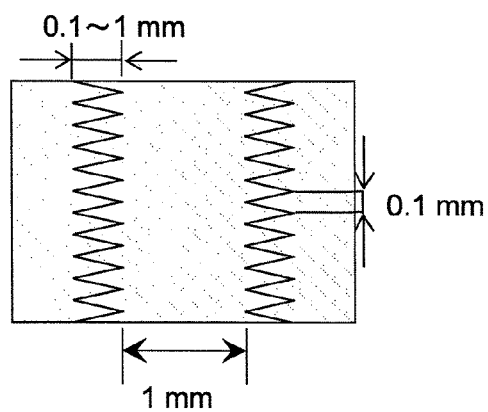
Figure 14C:
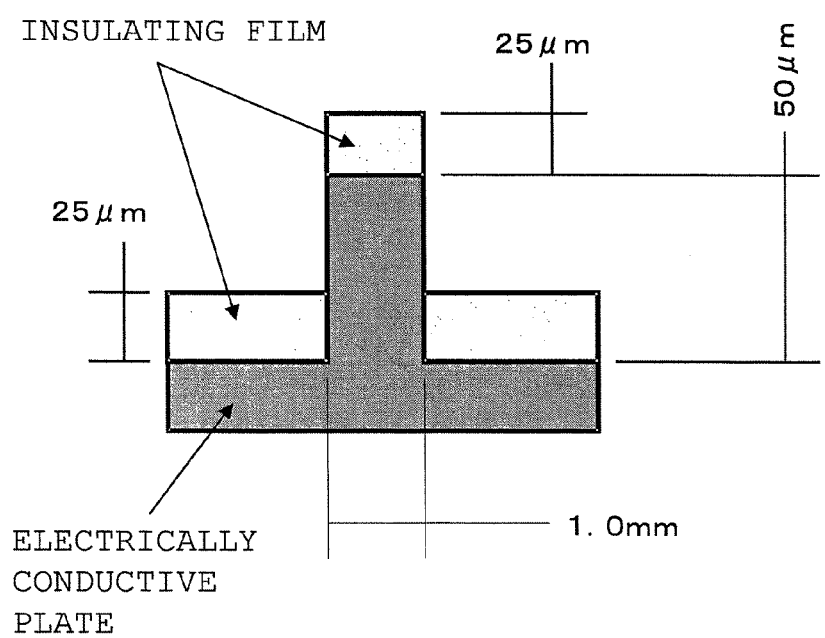

FIGS. 14A-14C are a set of views, wherein FIG. 14A is a perspective view showing the details of an electrical discharge countermeasure device according to a tenth embodiment, FIG. 14B is a top view of an electrically conductive plate columnar portion and its vicinity of FIG. 14A within a circle, and FIG. 14C is a cross-sectional view showing example dimensions. The electrical discharge countermeasure device of the present embodiment is identical in structure with that of the ninth embodiment shown in FIG. 13, except that the side surfaces of the columnar portion of the electrically conductive plate, which is formed to have a straightly elongated shape, are jagged as shown in the top view of FIG. 14B. For the electrical discharge countermeasure device of the tenth embodiment, actual emission of electrons was confirmed.

Figure 15A:
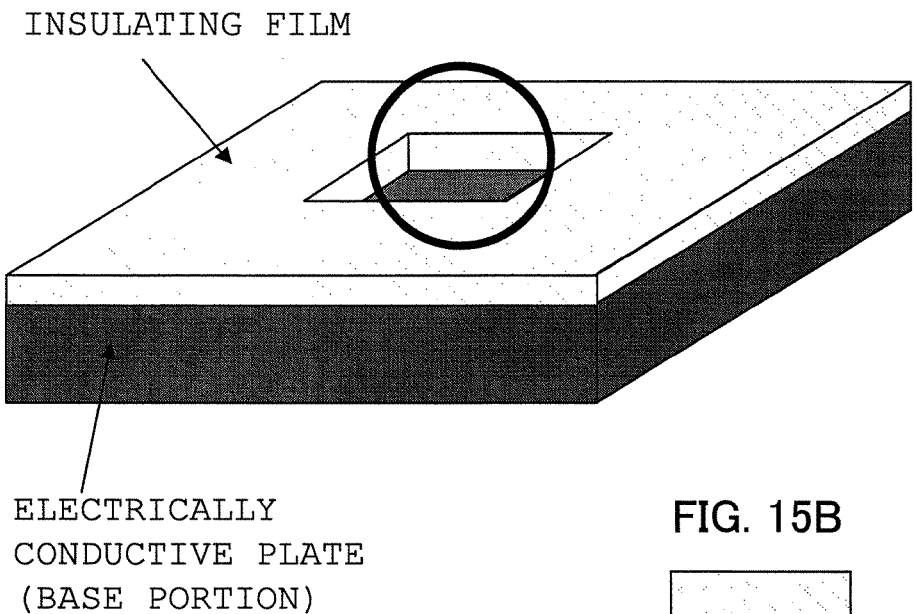
Figure 15B:
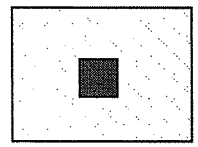
Figure 15C:
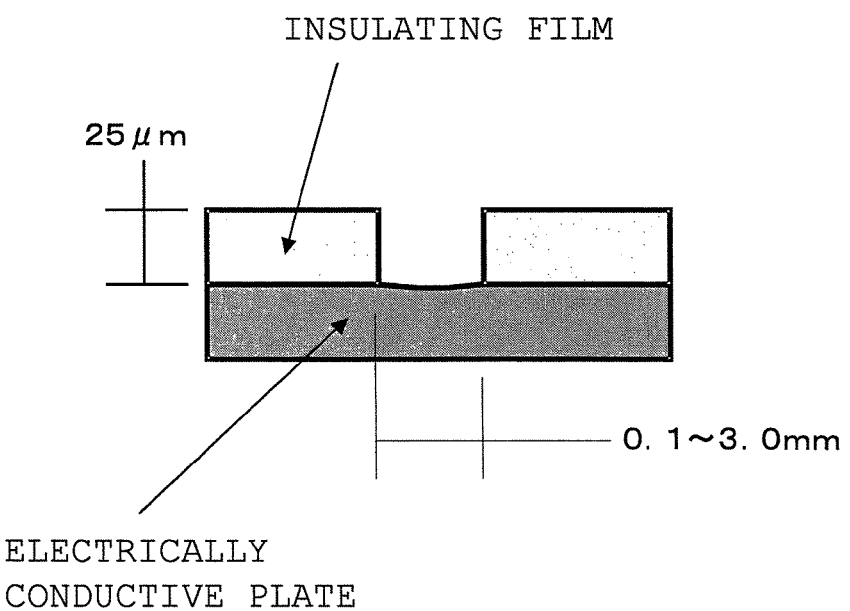

FIGS. 15A-15C is a set of views, wherein FIG. 15A is a perspective view showing the details of an electrical discharge countermeasure device according to an eleventh embodiment, FIG. 15B is a top view of an electrically conductive plate columnar portion and its vicinity of FIG. 15A within a circle, and FIG. 15C is a cross-sectional view showing example dimensions. The electrical discharge countermeasure device of the present embodiment is identical in structure with that of the seventh embodiment shown in FIG. 11, except that the columnar portion of the electrically conductive plate does not exist, and the insulating film is partially cut-removed so as to expose the surface of the electrically conductive plate. In the illustrated example, the exposed portion of the surface of the electrically conductive plate has a square shape. However, the exposed portion may have any other shape. The surface of the electrically conductive plate is exposed to the outside space via the cut-removed portion of the insulating film, and electrons are emitted therefrom.

Figure 16A:
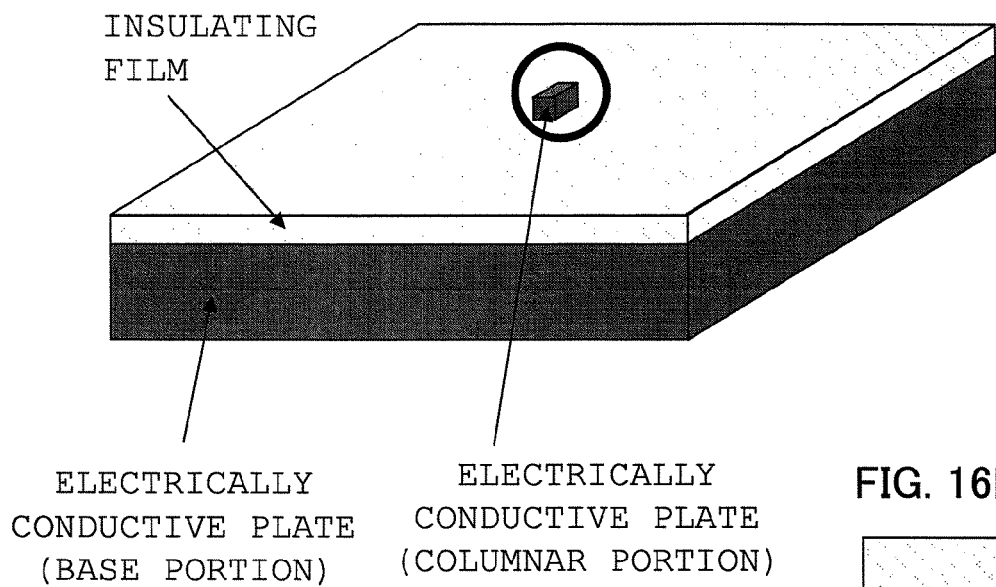
Figure 16B:
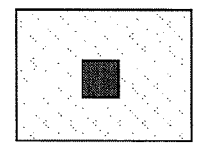
Figure 16C:
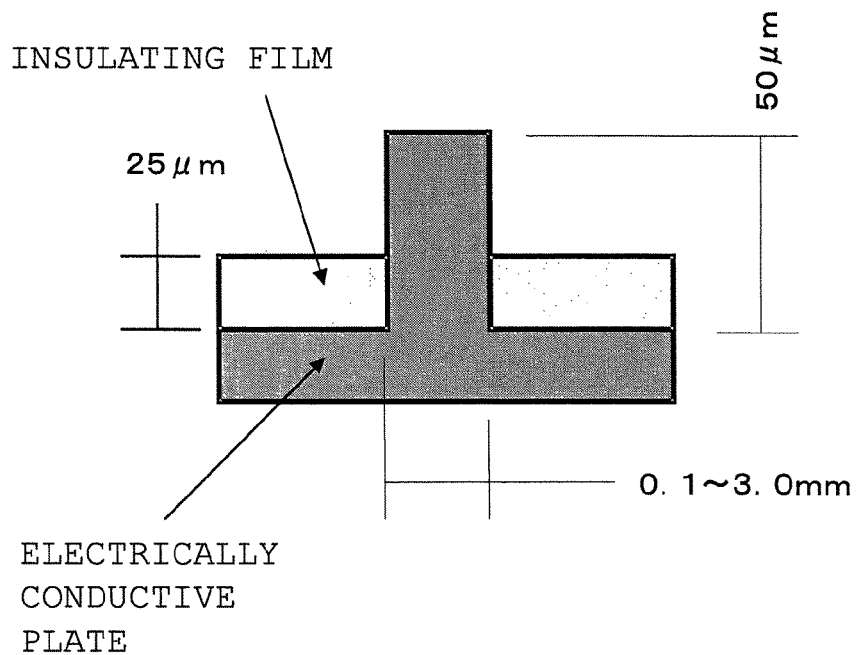

FIGS. 16A-16C is a set of views, wherein FIG. 16A is a perspective view showing the details of an electrical discharge countermeasure device according to a twelfth embodiment, FIG. 16B is a top view of an electrically conductive plate columnar portion and its vicinity of FIG. 16A within a circle, and FIG. 16C is a cross-sectional view showing example dimensions. The electrical discharge countermeasure device of the present embodiment is identical in structure with that of the seventh embodiment shown in FIG. 11, except that the upper surface of the columnar portion of the electrically conductive plate is not covered with the insulating film, so that the upper surface and side surfaces of the columnar portion of the electrically conductive plate are exposed to the outside space.

Figure 17A:
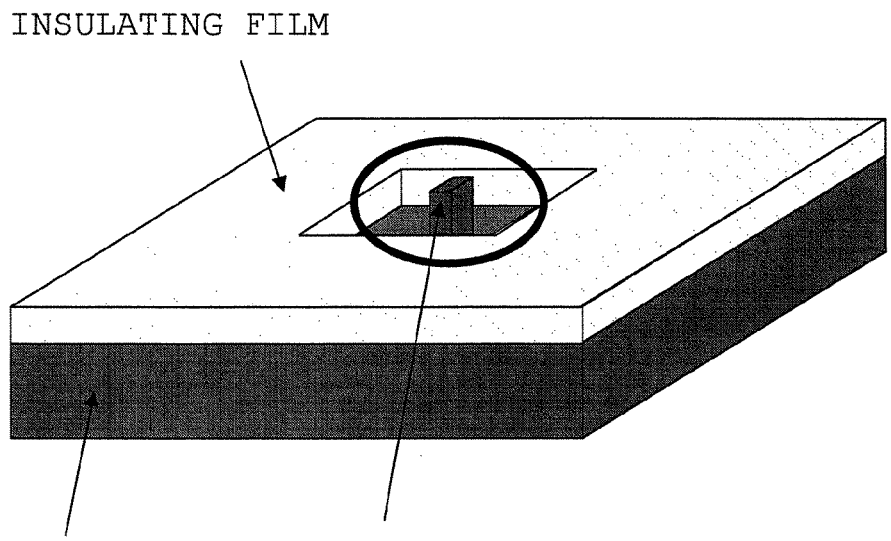
Figure 17B:
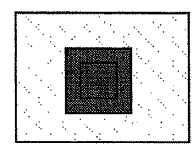
Figure 17C:
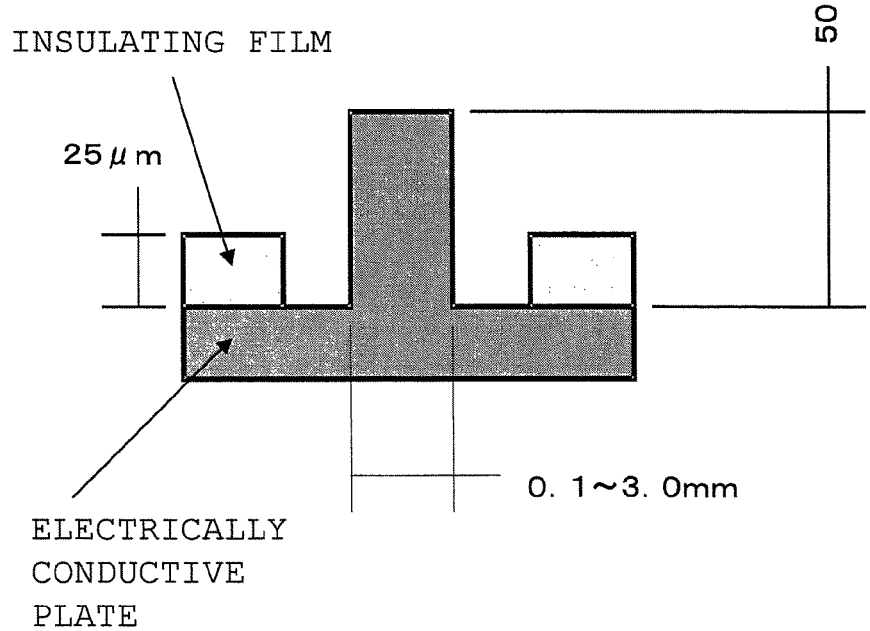

FIGS. 17A-17C are a set of views, wherein FIG. 17A is a perspective view showing the details of an electrical discharge countermeasure device according to a thirteenth eleventh embodiment, FIG. 17B is a top view of an electrically conductive plate columnar portion and its vicinity of FIG. 17A within a circle, and FIG. 17C is a cross-sectional view showing example dimensions. The electrical discharge countermeasure device of the present embodiment is identical in structure with that of the eighth embodiment shown in FIG. 12, except that the upper surface of the columnar portion of the electrically conductive plate is not covered with the insulating film, and is exposed to the outside space.

Figure 18A:
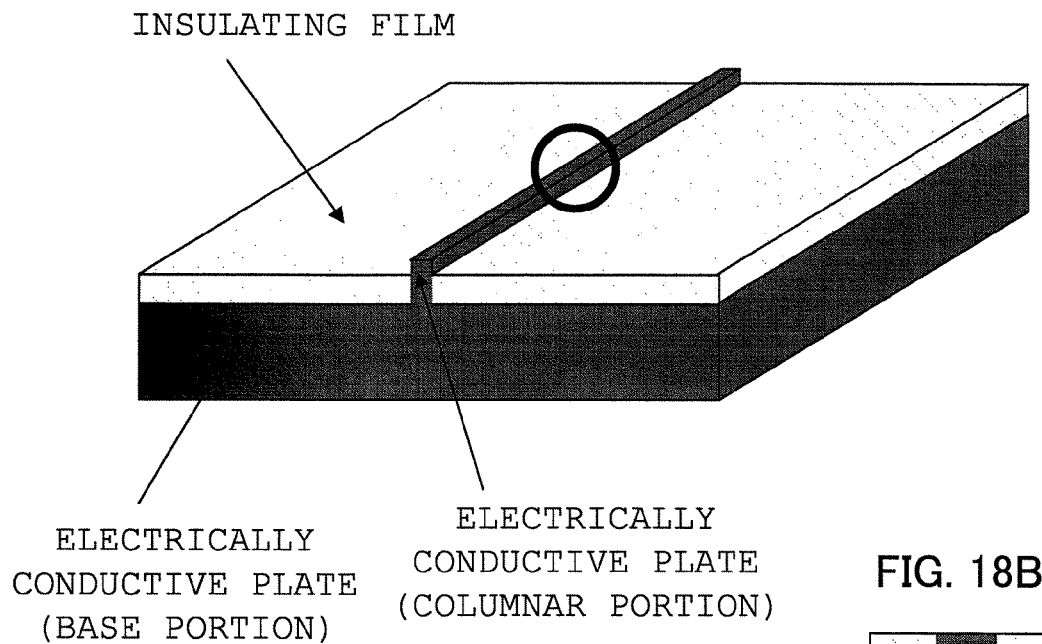
Figure 18B:
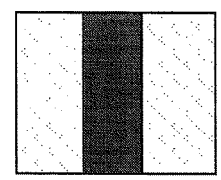
Figure 18C:
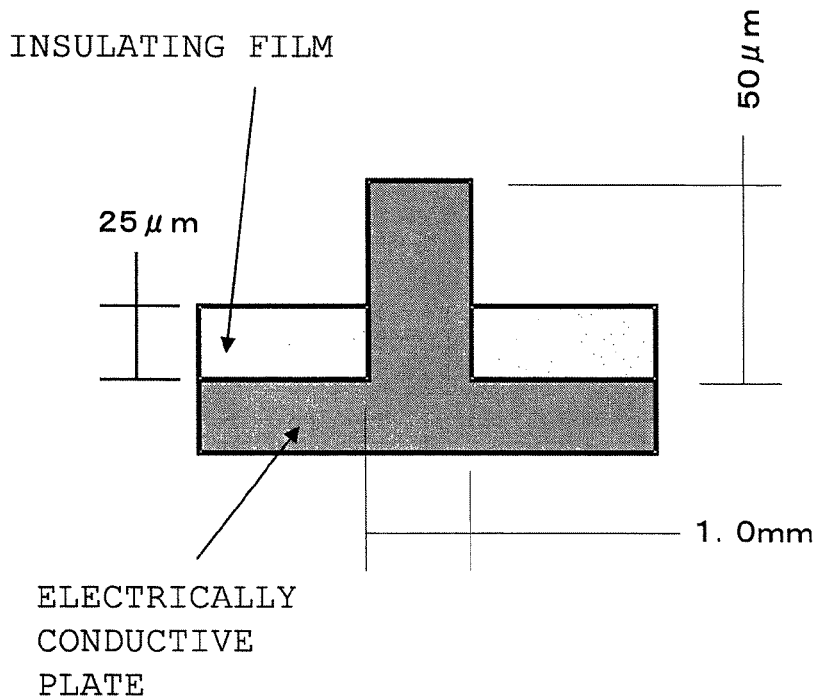

FIGS. 18A-18C are a set of views, wherein FIG. 18A is a perspective view showing the details of an electrical discharge countermeasure device according to a fourteenth embodiment, FIG. 18B is a top view of an electrically conductive plate columnar portion and its vicinity of FIG. 18A within a circle, and FIG. 18C is a cross-sectional view showing example dimensions. A straightly elongated columnar portion extends from the base portion of the electrically conductive plate (the lowermost layer) through the insulating film such that its distal end is exposed. The electrical discharge countermeasure device of the present embodiment is identical in structure with that of the ninth embodiment shown in FIG. 13, except that the upper surface of the straightly elongated columnar portion of the electrically conductive plate is not covered with the insulating film, and is exposed to the outside space.

Figure 19A:
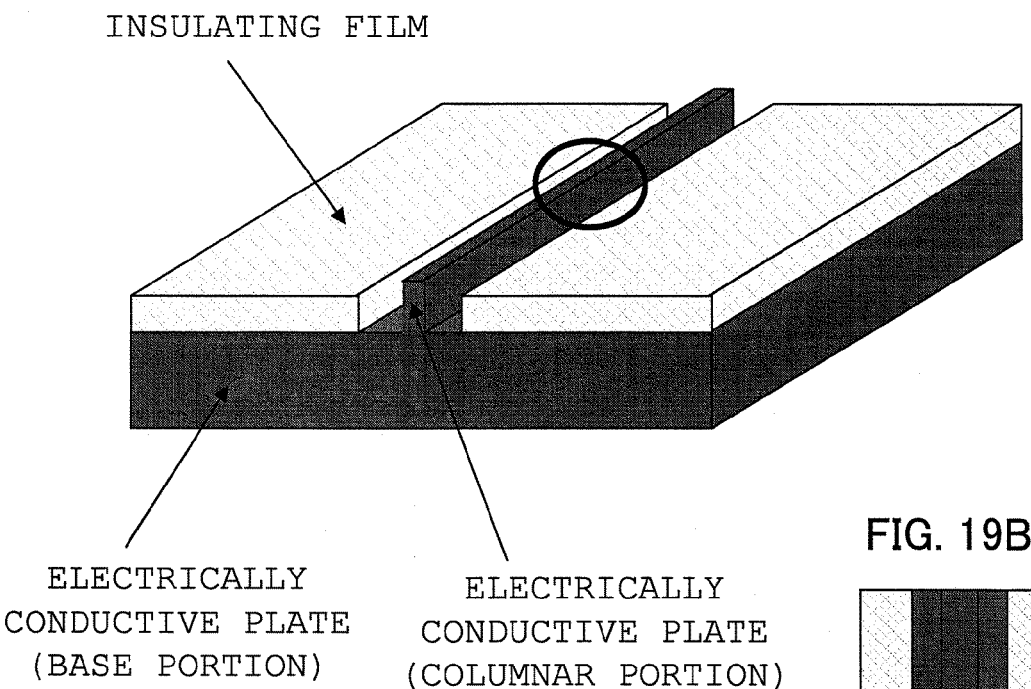
Figure 19B:
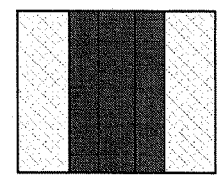
Figure 19C:
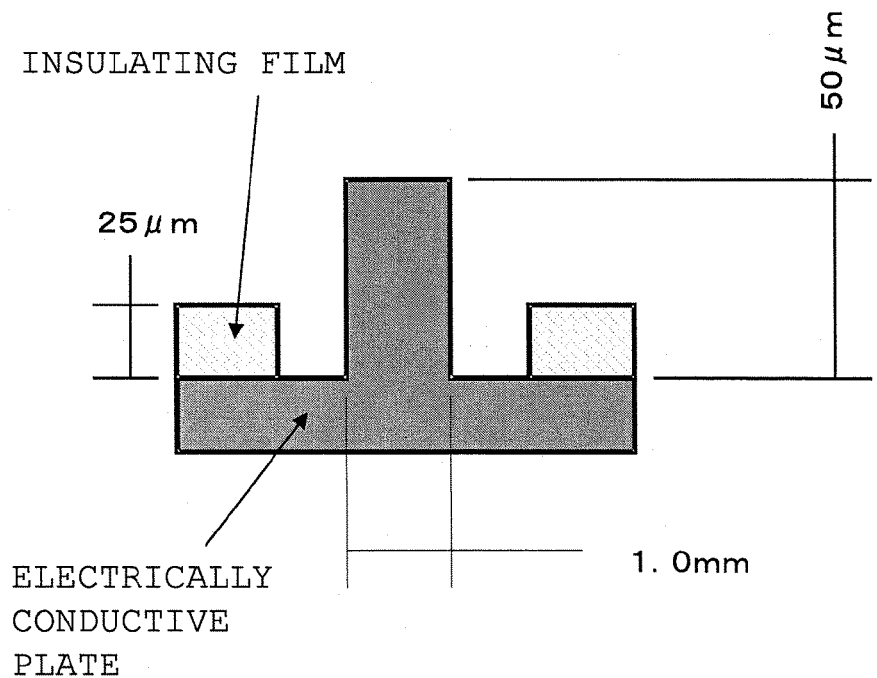

FIGS. 19A-19C is a set of views, wherein FIG. 19A is a perspective view showing the details of an electrical discharge countermeasure device according to a fifteenth embodiment, FIG. 19B is a top view of an electrically conductive plate columnar portion and its vicinity of FIG. 19A within a circle, and FIG. 19C is a cross-sectional view showing example dimensions. The electrical discharge countermeasure device of the present embodiment is identical in structure with that of the fourteenth embodiment shown in FIG. 18, except that not only the entire side surfaces of the straightly elongated columnar portion of the electrically conductive plate but also portions of the upper surface of the base portion of the electrically conductive plate, the portion being continuous with the side surfaces, are exposed to the outside space, without being covered with the insulating film.

Figure 20A:
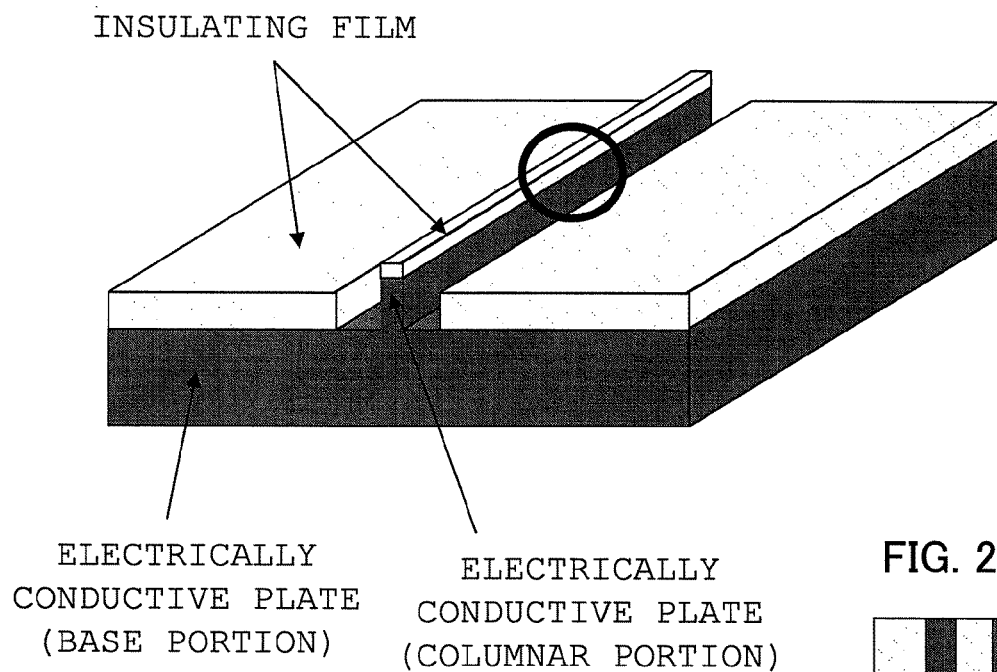
Figure 20B:
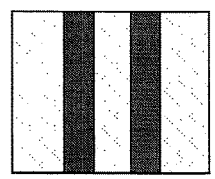
Figure 20C:
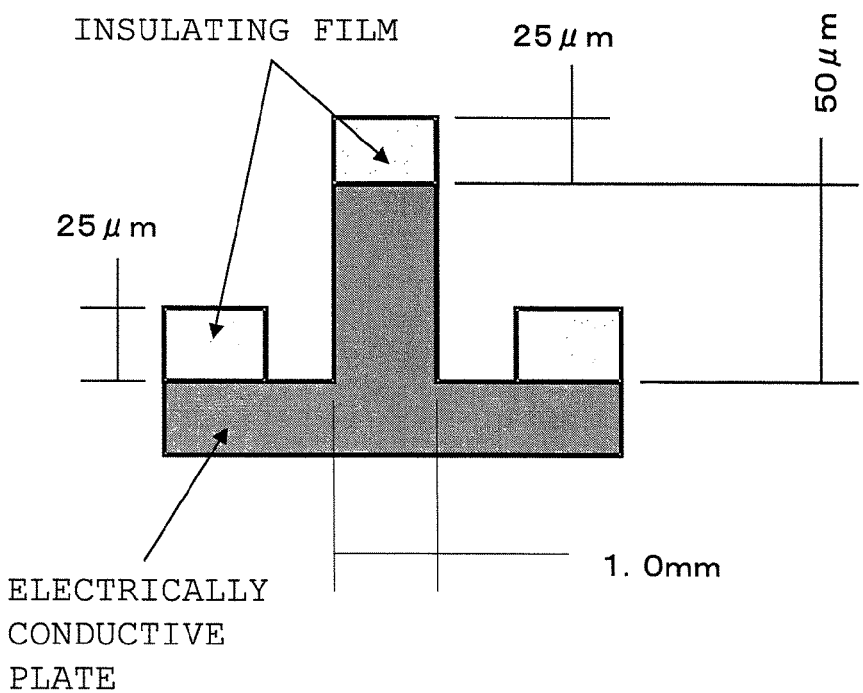

FIGS. 20A-20C are a set of views, wherein FIG. 20A is a perspective view showing the details of an electrical discharge countermeasure device according to a sixteenth embodiment, FIG. 20B is a top view of an electrically conductive plate columnar portion and its vicinity of FIG. 20A within a circle, and FIG. 20C is a cross-sectional view showing example dimensions. The electrical discharge countermeasure device of the present embodiment is identical in structure with that of the fifteenth embodiment shown in FIG. 19, except that the upper surface of the straightly elongated columnar portion of the electrically conductive plate is covered with the insulating film, the side surfaces of the columnar portion of the electrically conductive plate are exposed, and the upper surface of the base portion of the electrically conductive plate is exposed in areas extending from the opposite sides of the columnar portion and having a predetermined width.

Figure 21A:
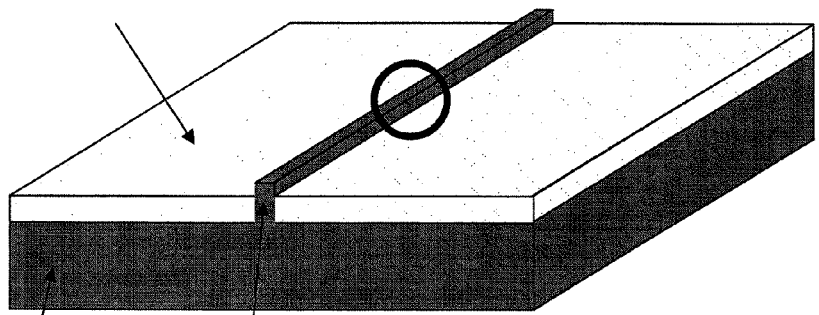
Figure 21B:
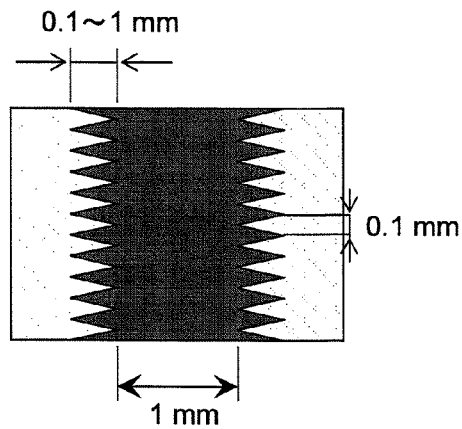
Figure 21C:
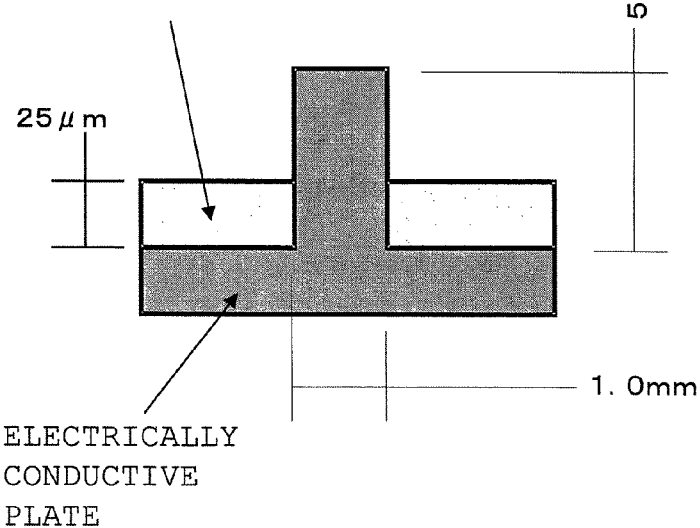

FIGS. 21A-21C are a set of views, wherein FIG. 21A is a perspective view showing the details of an electrical discharge countermeasure device according to a seventeenth embodiment, FIG. 21B is a top view of an electrically conductive plate columnar portion and its vicinity of FIG. 21A within a circle, and FIG. 21C is a cross-sectional view showing example dimensions. The electrical discharge countermeasure device of the present embodiment is identical in structure with that of the fourteenth embodiment shown in FIG. 18, except that the side surfaces of the straightly elongated columnar portion of the electrically conductive plate are jagged as shown in the top view of FIG. 21B.

Figure 22A:
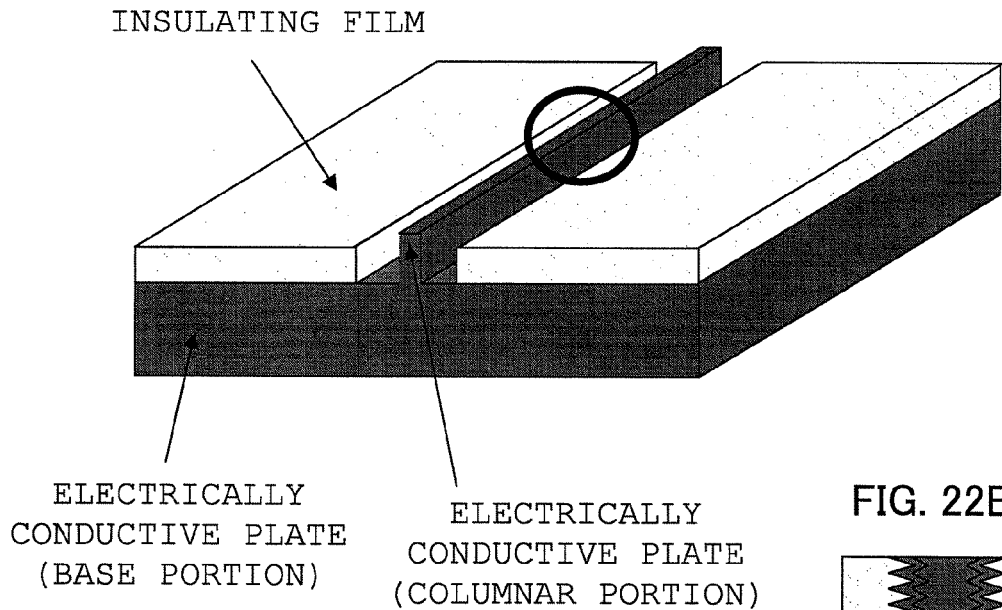
Figure 22B:
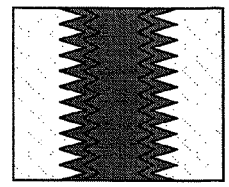
Figure 22C:
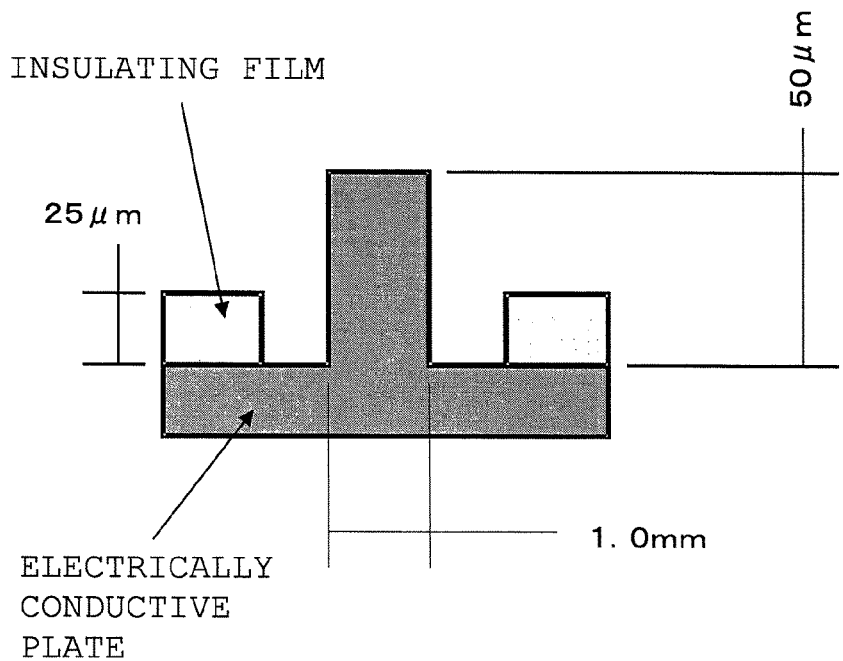

FIGS. 22A-22C is a set of views, wherein FIG. 22A is a perspective view showing the details of an electrical discharge countermeasure device according to an eighteenth embodiment, FIG. 22B is a top view of an electrically conductive plate columnar portion and its vicinity of FIG. 22A within a circle, and FIG. 22C is a cross-sectional view showing example dimensions. The electrical discharge countermeasure device of the present embodiment is identical in structure with that of the seventeenth embodiment shown in FIG. 21, except that the insulating film is partially cut-removed such that the side surfaces of the columnar portion of the electrically conductive plate are exposed, and the upper surface of the base portion of the electrically conductive plate is exposed in areas extending from the opposite sides of the columnar portion and having a predetermined width.

Figure 23A:
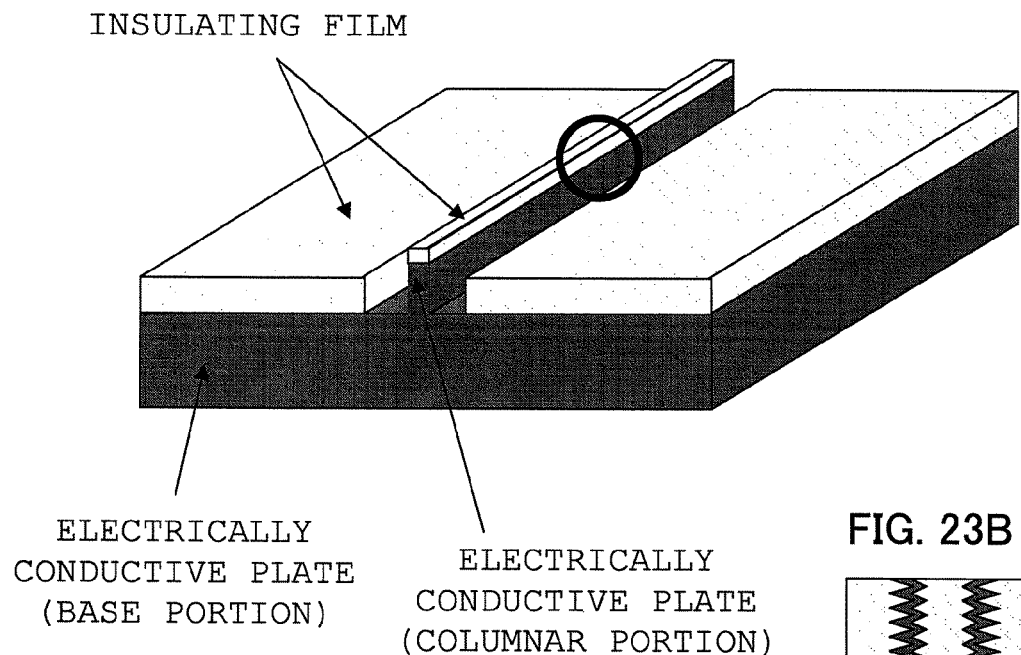
Figure 23B:
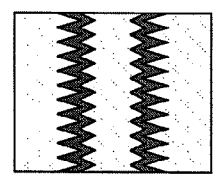
Figure 23C:
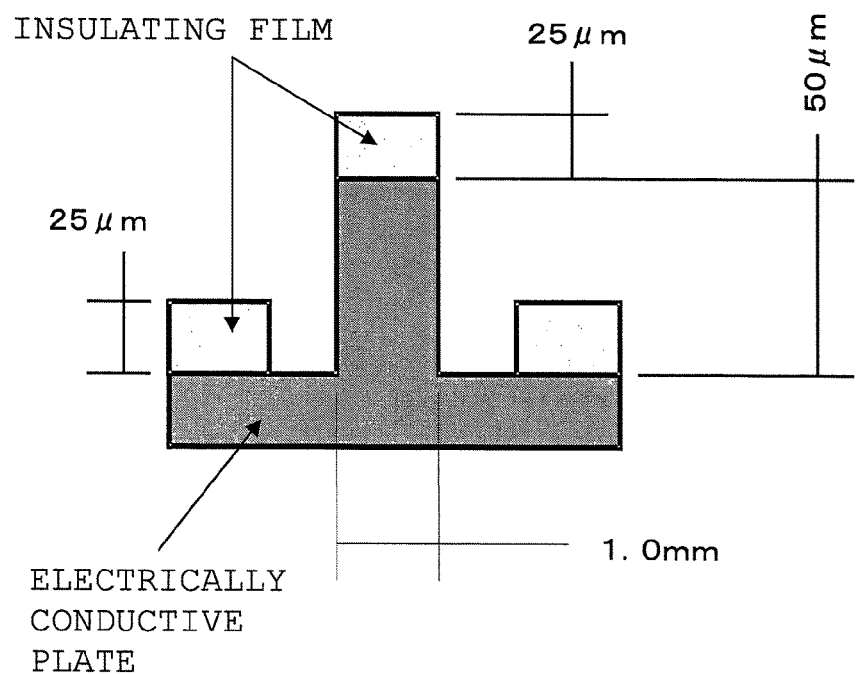

FIGS. 23A-23C are a set of views, wherein FIG. 23A is a perspective view showing the details of an electrical discharge countermeasure device according to a nineteenth embodiment, FIG. 23B is a top view of an electrically conductive plate columnar portion and its vicinity of FIG. 23A within a circle, and FIG. 23C is a cross-sectional view showing example dimensions. The electrical discharge countermeasure device of the present embodiment is identical in structure with that of the eighteenth embodiment shown in FIG. 22, except that an insulating film is attached to the upper surface of the columnar portion of the electrically conductive plate.

EXAMPLE 1

The electrical discharge countermeasure device of the first embodiment shown in FIG. 3A and FIG. 3B was manufactured on a trial basis by use of an insulating film and an insulating tape, both made of kapton (polyimide based; thickness: 0.063 mm), and an conductive adhesive s692 (an adhesive silicone resin including carbon), which was applied to form a layer having a thickness of about 1 mm. Although the conductive adhesive s692 has a conductivity, the conductivity is about $1/10^8$ to $1/10^9$ that of copper. The insulating film used in the trial manufacture was square (30 mm×30 mm).

A slight projection of the electrically conductive adhesive layer does not affect electron emission. However, if the distance between the insulating film and the edge of the electrically conductive adhesive layer becomes 1.58 mm or greater, electron emission does not occur. Therefore, the distance is desirably controlled to fall within a range of about 0.1 to about 1.58 mm, preferably about 0.1 to about 1 mm. The insulating tape must be partially cut-removed before or after the tape is bonded or fused. If a portion of the electrically conductive surface located in the area where the tape is cut-removed is exposed to the outside, discharge becomes more likely to occur. Therefore, the electrically conductive surface in that area is completely covered with the electrically conductive adhesive.

EXAMPLE 2

There was manufactured a test sample in which a solar cell is disposed at the center of an aluminum plate, and various electrical discharge countermeasure devices as described below were disposed around the solar cell. That is, the following electrical discharge countermeasure devices were used: a CFRP strip formed of CFRP (carbon-fiber reinforced plastic) and fixed by use of an electrically conductive adhesive RTV-s692 (Wacker Chemie AG); an S692 strip formed by applying the electrically conductive adhesive RTV-s692 in the form of a strip; a CFRP strip (rough) formed of CFRP (carbon-fiber reinforced plastic), fixed by use of the adhesive s692, and having its surface sanded; an S692 crown formed by applying the electrically conductive adhesive RTV-s692 in the form of a crown; a needle point holder formed of a carbon rod fixed by use of the adhesive s692 and covered with a polyimide-based polymer film (kapton manufactured by Permacel Corp.); and a needle point holder (no needle) which was formed by removing the carbon rod from the needle point holder and in which the adhesive s692 was covered by a kapton layer having holes. An exposed portion of the aluminum plate (coupon frame) was covered with kapton. Hereinafter, the test sample will be referred to as a "coupon."

Figure 24:
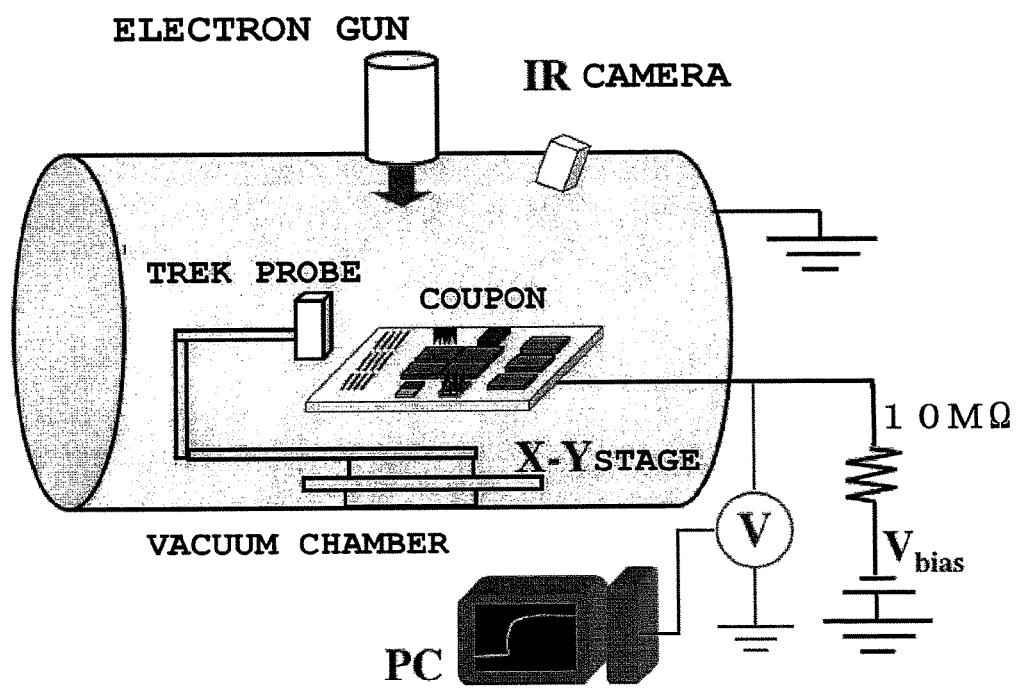
FIG. 24 is a view showing an experiment system.
Figure 25:
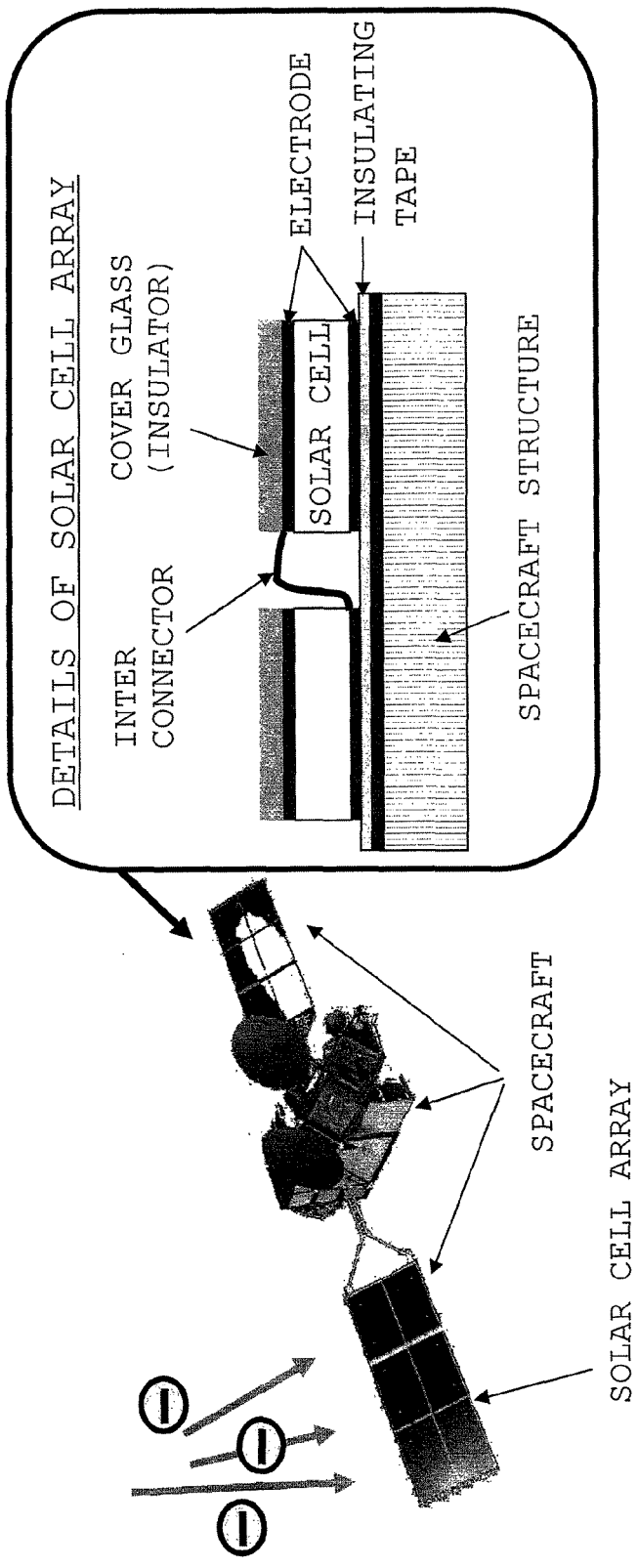
FIG. 25 is a set of views including a view schematically showing a spacecraft (satellite) and a detail view showing, in cross section, a portion of a solar cell array thereof.

FIG. 24 is a view showing an experiment system. As shown in FIG. 24, in order to simulate a geostationary orbit environment in which a substorm has occurred, coupons were placed on an X-Y stage within a vacuum chamber; the coupon frame was biased by means of a high-voltage power source Vbias via a resistor of 10 MW; and high-energy electrons were radiated from an electron gun, whereby the coupons were placed in a substorm environment. The X-Y stage and a Trek probe in FIG. 24 were used for measurement of surface potential. In order to form a inverted potential gradient in the solar cell (the potential of the cover glass>the potential of the metal portion of the cell), an electron beam voltage of 5.2 to 5.0 keV was selected for a bias voltage of −5 kV, which is the condition under which the secondary electron emission coefficient (reflected electrons/incident electrons) becomes equal to or greater than 1.

The purpose of this experiment is to cause electric field emission by using, as a trigger, charging by an electron beam. Field electron emission is expected to occur due to the shape of a mall projection or the like of the electrically conductive adhesive s692 and charging of insulating members therearound. It is considered that at the time when this phenomenon occurs, electrons emitted to the space (the grounded chamber wall) form a current loop via the ground, to thereby lower the bias voltage of the coupon. Therefore, at appropriate intervals, the potential of the coupon was monitored, and the results of monitoring were stored in a PC.

The above-described experiment system allowed us to successfully confirm occurrence of electron emission. We confirmed the occurrence of electron emission from an increase in the coupon negative bias potential and a light emission image captured by an IR camera. Further, we confirmed that no discharge occurs in the solar cell in a state where electron emission is taking place.

Electric field emission occurred from the carbon rod needle point holder, the needle point holder (no rod), and the CFRP strip. The common feature among these is use of the electrically conductive adhesive s692. Further, electric field emission did not occur from the strip and the crown of the electrically conductive adhesive s692. Therefore, it can be said that electric field emission occurs when a sheet-shaped insulating material is bonded to the coupon by use of the electrically conductive adhesive s692.

When a layer of the electrically conductive adhesive s692 is placed under the insulating sheet and irradiated with an electron beam, electric field emission occurs mainly at the side surfaces thereof. That is, it becomes possible to construct an electrical discharge prevention system which is attached to a geostationary orbit spacecraft and which automatically emits electrons when the spacecraft encounters a substorm and the potential of the spacecraft becomes negative, in order to make the potential of the spacecraft positive, to thereby prevent inverted potential gradient. Although a emission current of 0.15 mA was observed in the case of the sample used in the experiment, along a geostatic orbit, emission current of about 10 mA can prevent the potential of the spacecraft from becoming negative even when the spacecraft encounters a substorm. Therefore, it is estimated that discharge can be prevented by attaching 100 electrical discharge countermeasure devices each having a size of a few centimeters×a few centimeters to various portions of the spacecraft; e.g., various portions of the solar cell panel (for example, at the termination ends of about 100 solar cell circuits). The spacecraft structure and a panel to which solar cells are attached are structurally connected, and both the spacecraft structure and the panel are conductors. Therefore, the potential difference between the spacecraft structure and the panel is small. Accordingly, in order to prevent the solar cells from being broken by discharge, the potential of the spacecraft structure, on which the solar cells are not provided, must be prevented from lowering. Therefore, placement of electrical discharge countermeasure devices on the spacecraft structure is meaningful.

The invention claimed is:

1. An electrical discharge countermeasure device for preventing occurrence of electrical discharge on an electrically conductive structure in an environment in which high-energy electrons impinge onto the structure or on an electronic element mounted to a surface of the structure, which electrical discharge would otherwise occur when the potential of the structure or the electronic element increases in the negative direction due to a negative charge flowing thereinto, the electrical discharge countermeasure device comprising:

an insulating tape bonded to the surface of the electrically conductive structure, the insulating tape being partially cut-removed so as to expose a portion of the surface of the electrically conductive structure;

an electrically conductive adhesive applied to the exposed portion of the surface of the electrically conductive structure; and an insulating film or a plastic film reinforced by electrically conductive fibers, which is bonded to the electrically conductive adhesive, such that a portion of the electrically conductive adhesive is exposed to the outside, wherein when the electrically conductive structure encounters higher-energy electrons, the insulating film or the plastic film reinforced by electrically conductive fibers is charged, so that a strong electric field is applied to the electrically conductive adhesive, and electrons are emitted from the electrically conductive adhesive through field electron emission, to thereby prevent the potential of the electrically conductive structure from increasing in the negative direction.

2. An electrical discharge countermeasure device according to claim 1, wherein both the insulating tape and the insulating film are formed of a polyimide-based polymer material, and the electrically conductive adhesive is a carbon-based adhesive.

3. An electrical discharge countermeasure device according to claim 1, wherein the portion of electrically conductive adhesive exposed to the outside is an edge portion of the electrically conductive adhesive located around the insulating film or the plastic film reinforced by electrically conductive fibers.

4. An electrical discharge countermeasure device according to claim 1, wherein the portion of the electrically conductive adhesive exposed to the outside is an edge portion of the electrically conductive adhesive located around the insulating film, an electrically conductive rod inserted into a hole of the insulating film and bonded to the electrically conductive adhesive, a hole formed in the insulating film, or a combination of thereof.

5. An electrical discharge countermeasure device for preventing occurrence of electrical discharge on an electrically conductive structure in an environment in which high-energy electrons impinge onto the structure or on an electronic element mounted to a surface of the structure, which electrical discharge would otherwise occur when the potential of the structure or the electronic element increases in the negative direction due to a negative charge flowing thereinto, the electrical discharge countermeasure device comprising:

an electrically conductive plate fixed to a surface of an insulating tape bonded to the surface of the electrically conductive structure and electrically connected to the electrically conductive structure;

an electrically conductive adhesive which covers the electrically conductive plate; and an insulating film or a plastic film reinforced by electrically conductive fibers which is bonded to the electrically conductive adhesive, such that a portion of the electrically conductive adhesive is exposed to the outside, wherein when the electrically conductive structure encounters higher-energy electrons, the insulating film or the plastic film reinforced by electrically conductive fibers is charged, so that a strong electric field is applied to the electrically conductive adhesive, and electrons are emitted from the electrically conductive adhesive through field electron emission, to thereby prevent the potential of the electrically conductive structure from increasing in the negative direction.

6. An electrical discharge countermeasure device according to claim 5, wherein both the insulating tape and the insulating film are formed of a polyimide-based polymer material, and the electrically conductive adhesive is a carbon-based adhesive.

7. An electrical discharge countermeasure device according to claim 5, wherein the portion of the electrically conductive adhesive exposed to the outside is an edge portion of the layer of the electrically conductive adhesive located around the insulating film or the plastic film reinforced by electrically conductive fibers.

8. An electrical discharge countermeasure device according to claim 5, wherein the portion of the electrically conductive adhesive exposed to the outside is an edge portion of the electrically conductive adhesive located around the insulating film, an electrically conductive rod inserted into a hole of the insulating film and bonded to the electrically conductive adhesive layer, a hole formed in the insulating film, or a combination of thereof.

9. An electrical discharge countermeasure device for preventing occurrence of electrical discharge on an electrically conductive structure in an environment in which high-energy electrons impinge onto the structure or on an electronic element mounted to a surface of the structure, which electrical discharge would otherwise occur when the potential of the structure or the electronic element increases in the negative direction due to a negative charge flowing thereinto, the electrical discharge countermeasure device comprising:

an insulating tape bonded to the surface of the electrically conductive structure, the insulating tape being partially cut-removed so as to expose a portion of the surface of the electrically conductive structure;

an electrically conductive adhesive applied to the exposed portion of the surface of the electrically conductive structure;

an electrically conductive plate electrically connected to the electrically conductive structure via the electrically conductive adhesive; and an insulating film or a plastic film reinforced by electrically conductive fibers which is bonded to an upper surface of the electrically conductive plate such that a portion of the upper surface is exposed to the outside, wherein when the electrically conductive structure encounters higher-energy electrons, the insulating film or the plastic film reinforced by electrically conductive fibers is charged, so that a strong electric field is applied to the electrically conductive plate, and electrons are emitted from the electrically conductive plate through field electron emission, to thereby prevent the potential of the electrically conductive structure from increasing in the negative direction.

10. An electrical discharge countermeasure device according to claim 9, wherein the electrically conductive plate includes a flat-plate-shaped base portion fixed to the electrically conducive structure by means of the electrically conductive adhesive, and a columnar portion extending vertically upward from the center of the base portion.

11. An electrical discharge countermeasure device according to claim 9, wherein the electrically conductive plate is bonded to the insulating tape on the upper surface of the electrically conducive structure by means of an insulative adhesive in a state in which at least side surfaces of the electrically conductive plate are covered by the insulative adhesive.

* * * * *